US012772407B2

(12) United States Patent
Chen et al.

(10) Patent No.: US 12,772,407 B2
(45) Date of Patent: Oct. 20, 2026

(54) COLD PLUG STORAGE COMPONENT TRAY SYSTEM

(71) Applicant: Dell Products L.P., Round Rock, TX (US)

(72) Inventors: Yi-Chang Chen, New Taipei City (TW); Po Li Hsieh, Taoyuan (TW); Pei-Chuan Hsieh, Xizhi District (TW); Haocheng Ku, Taipei City (TW); Kuang-Hsi Lin, Bade District (TW); Yufeng Lin, Da'an District (TW)

(73) Assignee: Dell Products L.P., Round Rock, TX (US)

( * ) Notice: Subject to any disclaimer, the term of this patent is extended or adjusted under 35 U.S.C. 154(b) by 102 days.

(21) Appl. No.: 18/950,402

(22) Filed: Nov. 18, 2024

(65) Prior Publication Data

US 2026/0143615 A1 May 21, 2026

(51) Int. Cl.
*H05K 7/14* (2006.01)

(52) U.S. Cl.
CPC ......... *H05K 7/1487* (2013.01); *H05K 7/1489* (2013.01)

(58) Field of Classification Search
CPC combination set(s) only.
See application file for complete search history.

(56) References Cited

U.S. PATENT DOCUMENTS 8,339,780 B2 * 12/2012 Terwilliger .......... G11B 33/128 361/801
8,941,982 B2 * 1/2015 Terwilliger ............. G06F 1/187 361/679.33
9,232,678 B2 * 1/2016 Bailey .................. H05K 7/1492
10,687,435 B2 * 6/2020 Adrian ................. H05K 7/1498
11,003,613 B2 * 5/2021 Escamilla ............. G06F 13/409
11,032,934 B1 * 6/2021 Adrian ................. G11B 33/122
11,419,233 B2 * 8/2022 Zhai ..................... H05K 7/1405
11,558,974 B2 * 1/2023 Escamilla ............ H05K 7/1487
12,262,506 B2 * 3/2025 Korta ................. H05K 7/20254
2012/0134092 A1 * 5/2012 Terwilliger .......... G11B 33/122 361/679.33
2013/0077231 A1 * 3/2013 Terwilliger .......... G11B 33/126 361/679.33
2015/0181747 A1 * 6/2015 Bailey ........................ G06F 1/20 361/679.48
2015/0189787 A1 * 7/2015 Bailey ................ H05K 7/20736 361/679.48
2025/0248005 A1 * 7/2025 Sy ...................... H05K 7/20781
(Continued)

*Primary Examiner* — Lisa Lea-Edmonds
(74) *Attorney, Agent, or Firm* — Terrile, Cannatti & Chambers, LLP; Stephen A. Terrile

(57) ABSTRACT

A tray system for use with a storage system for an information handling system. The tray system for use with a storage system for an information handling system includes a right wall portion; a left wall portion; and, a base panel component, the right wall component extending substantially perpendicularly from the base panel component, the left wall component extending substantially perpendicularly from the base panel component, the base panel component comprising a base panel portion and a tray extension, the tray extension extending horizontally from a rear edge of the base panel portion, the tray extension being configured to perform a cold plug function.

18 Claims, 21 Drawing Sheets

(56) References Cited

U.S. PATENT DOCUMENTS

| | | | | |
|---|---|---|---|---|
| 2026/0023414 | A1 * | 1/2026 | Chen | G06F 1/185 |
| 2026/0025937 | A1 * | 1/2026 | Hsieh | H05K 7/1487 |
| 2026/0082501 | A1 * | 3/2026 | Donachy | H05K 7/1402 |

* cited by examiner

COLD PLUG STORAGE COMPONENT TRAY SYSTEM

BACKGROUND OF THE INVENTION

Field of the Invention

The present invention relates to information handling systems. More specifically, embodiments of the invention relate to server type information handling systems within information technology (IT) environments.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

It is known to use information handling systems and related IT systems within information technology (IT) environments such as data centers.

SUMMARY OF THE INVENTION

A system and method for providing a storage system with a storage system storage component tray system.

In one embodiment, the invention relates to a tray system for use with a storage system for an information handling system, comprising: a right wall portion; a left wall portion; and, a base panel component, the right wall component extending substantially perpendicularly from the base panel component, the left wall component extending substantially perpendicularly from the base panel component, the base panel component comprising a base panel portion and a tray extension, the tray extension extending horizontally from a rear edge of the base panel portion, the tray extension being configured to perform a cold plug function.

In another embodiment, the invention relates to a storage system comprising: a storage component; and, a tray system, the tray system comprising a right wall portion; a left wall portion; and, a base panel component, the right wall component extending substantially perpendicularly from the base panel component, the left wall component extending substantially perpendicularly from the base panel component, the base panel component comprising a base panel portion and a tray extension, the tray extension extending horizontally from a rear edge of the base panel portion, the tray extension being configured to perform a cold plug function.

In another embodiment, the invention relates to a system comprising: a chassis; a processor contained within the chassis; a data bus coupled to the processor; a storage system; and, a tray system for mounting the storage system, the tray system comprising a right wall portion; a left wall portion; and, a base panel component, the right wall component extending substantially perpendicularly from the base panel component, the left wall component extending substantially perpendicularly from the base panel component, the base panel component comprising a base panel portion and a tray extension, the tray extension extending horizontally from a rear edge of the base panel portion, the tray extension being configured to perform a cold plug function.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

Figure 1:
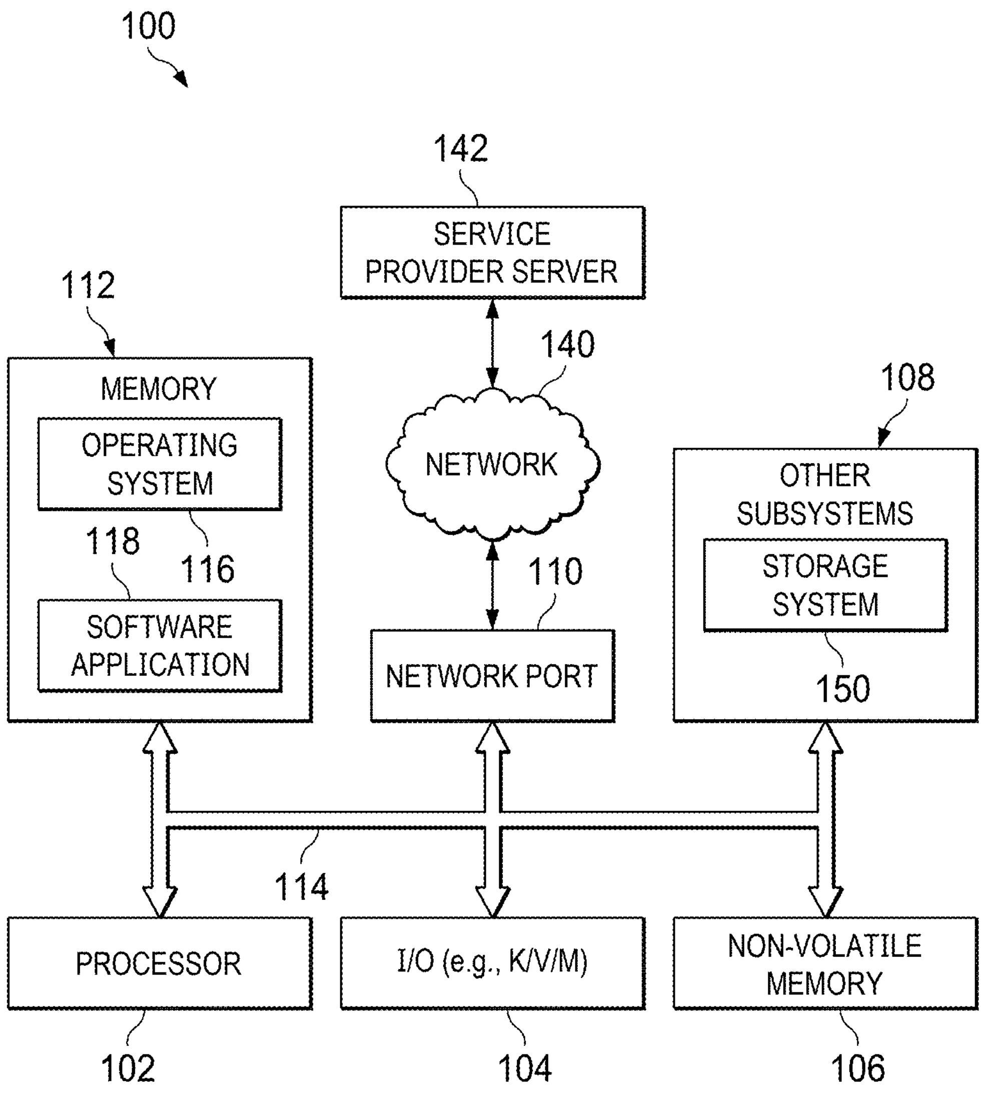
FIG. 1 shows a general illustration of components of an information handling system as implemented in the system and method of the present invention.

Various aspects of the disclosure include an appreciation that it is known to provide information handling systems with storage systems such as boot optimized storage systems (BOSS) and open compute project (OCP) type storage systems. Various aspects of the present disclosure include an appreciation that it is known to provide storage systems which can mount a plurality of storage components. Various aspects of the present disclosure include an appreciation that each of the plurality of storage components can include one or more storage devices. Various aspects of the present disclosure include an appreciation that the one or more storage devices often conform to particular storage device specifications. Various aspects of the present disclosure include an appreciation that one such storage device specification is the M.2 storage device specification. Various aspects of the present disclosure include an appreciation that storage device specification often defines particular dimensions for cards, such as internal memory cards, for the cards to conform to the storage device specification.

Various aspects of the present disclosure include an appreciation that certain known storage components, such as certain boot optimized storage system type storage components and certain OCP type storage components, do not support a hot plug function. Various aspects of the present disclosure include an appreciation that attempting to perform a hot plug function with a storage component that does not support such a function could damage the storage component. Various aspects of the present disclosure include an appreciation that the form factor of a boot optimized storage system type storage component is similar to that of the form factor of an OCP type storage component.

A system and method are disclosed for providing a storage system with a storage component tray system. In certain embodiments, the storage component tray system includes a storage component cold plug system.

In certain embodiments, the storage component cold plug system includes a storage system cold plug tray component. In certain embodiments, the storage system cold plug tray component includes a cold plug plunger device. In certain embodiments, the cold plug plunger device prevents a storage component from being hot plugged into a chassis of an information handling system. In certain embodiments, the storage system cold plug tray component is configured to mount BOSS storage components, OCP type storage components, or a combination thereof. In certain embodiments, the cold plug plunger device prevents BOSS storage components, OCP type storage components, or a combination thereof, from being hot plugged into a chassis of an information handling system.

In certain embodiments, when installing the storage component cold plug system into a chassis of an information handling system the cold plug plunger device engages with the chassis to stop insertion of the storage component cold plug system. The cold plug plunger device would then need to be activated to allow further insertion of the storage component cold plug system into the chassis. In certain embodiments, a user pulls the cold plug plunger device upwardly to disengage the stop function. Once disengaged, the storage component cold plug system may be fully inserted and physically attached to the chasses. In certain embodiments, the storage component cold plug system can only be installed to a chassis of an information handling system after a top cover of the chassis is opened to provide internal access to the chassis. In certain embodiments, such a storage component cold plug system prevents hot plug damage to storage components of the storage system.

In certain embodiments, the storage component cold plug system provides a storage system tray which may be physically attached to a chassis of an information handling system without the need for a front side thumb-screw. In certain embodiments, the cold plug plunger device enables a storage system tray to be physically attached to a chassis of an information handling system within the need for a front side thumb-screw.

In certain embodiments, the storage system cold plug tray component includes a tray extension. In certain embodiments, the tray extension is included within a base panel of the storage system cold plug tray component. In certain embodiments, the tray extension is integral with the base panel of the storage system cold plug tray component. In certain embodiments, the tray extension includes the cold plug plunger device. In certain embodiments, the cold plug plunger device is physically positioned on the tray extension component to prevent external hot plugging of the storage system cold plug system.

In certain embodiments, the storage system comprises a boot optimized storage system. In certain embodiments, the boot optimized storage system comprises a redundant array of independent disks (RAID) solution optimized for booting an operating system of a server. In certain embodiments, the boot optimized storage system comprises a plurality of serial advanced technology advancement (SATA) solid state devices (SSDs), a host interface (such as a PCIe host interface), a device interface (such as a SATA device interface), or a combination thereof. In certain embodiments, the solid state devices are included within a storage card. In certain embodiments, the storage card corresponds to an M.2 type storage card. In certain embodiments, the storage card corresponds to a boot optimized storage system M.2 type storage card.

FIG. 1 shows a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, and associated controllers, a hard drive or disk storage 106, and various other subsystems 108. In various embodiments, the information handling system 100 also includes network port 110 operable to connect to a network 140, which is likewise accessible by a service provider server 142. In various embodiments, one or both the other subsystems 108 or the network port 110 include storage system 150. The information handling system 100 likewise includes system memory 112, which is interconnected to the foregoing via one or more buses 114. System memory 112 further comprises operating system (OS) 116. In certain embodiments, the information handling system 100 is one of a plurality of information handling systems within a data center. In certain embodiments, the information handling system 100 comprises a server type information handling system. In certain embodiments, the server type information handling system is configured to be mounted within a server rack. In certain embodiments, the other subsystem 108 includes one or more power supplies for supplying power to the other components of the information handling system 100.

In certain embodiments, the information handling system 100 comprises a server type information handling system. In certain embodiments, the server type information handling system comprises a blade server type information handling system. As used herein, a blade server type information handling system broadly refers to an information handling system which is physically configured to be mounted within a server rack.

In certain embodiments, the storage system 150 includes a storage component tray system. In certain embodiments, the storage component tray system includes a storage component cold plug system. In certain embodiments, the storage component cold plug system includes a storage system cold plug tray component. In certain embodiments, the storage system cold plug tray component includes a cold plug plunger device. In certain embodiments, the cold plug plunger device prevents a storage component from being hot plugged into a chassis of an information handling system. In certain embodiments, the storage system cold plug tray component is configured to mount BOSS storage components, OCP type storage components, or a combination thereof. In certain embodiments, the cold plug plunger device prevents BOSS storage components, OCP type storage components, or a combination thereof, from being hot plugged into a chassis of an information handling system.

In certain embodiments, when installing the storage component cold plug system into a chassis of an information handling system the cold plug plunger device engages with the chassis to stop insertion of the storage component cold plug system. The cold plug plunger device would then need to be activated to allow further insertion of the storage component cold plug system into the chassis. In certain embodiments, a user pulls the cold plug plunger device upwardly to disengage the stop function. Once disengaged, the storage component cold plug system may be fully inserted and physically attached to the chasses. In certain embodiments, the storage component cold plug system can only be installed to a chassis of an information handling system after a top cover of the chassis is opened to provide internal access to the chassis. In certain embodiments, such a storage component cold plug system prevents hot plug damage to storage components of the storage system.

In certain embodiments, the storage component cold plug system provides a storage system tray which may be physically attached to a chassis of an information handling system within the need for a front side thumb-screw. In certain embodiments, the cold plug plunger device enables a storage system tray to be physically attached to a chassis of an information handling system within the need for a front side thumb-screw.

In certain embodiments, the storage system cold plug tray component includes a tray extension. In certain embodiments, the tray extension is included within a base panel of the storage system cold plug tray component. In certain embodiments, the tray extension is integral with the base panel of the storage system cold plug tray component. In certain embodiments, the tray extension includes the cold plug plunger device. In certain embodiments, the cold plug plunger device is physically positioned on the tray extension component to prevent external hot plugging of the storage system cold plug system.

In certain embodiments, the storage system comprises a boot optimized storage system. In certain embodiments, the boot optimized storage system comprises a redundant array of independent disks (RAID) solution optimized for booting an operating system of a server. In certain embodiments, the boot optimized storage system comprises a plurality of serial advanced technology advancement (SATA) solid state devices (SSDs), a host interface (such as a PCIe host interface), a device interface (such as a SATA device interface), or a combination thereof. In certain embodiments, the solid state devices are included within a storage card. In certain embodiments, the storage card corresponds to an M.2 type storage card. In certain embodiments, the storage card corresponds to a boot optimized storage system M.2 type storage card.

Figure 2:
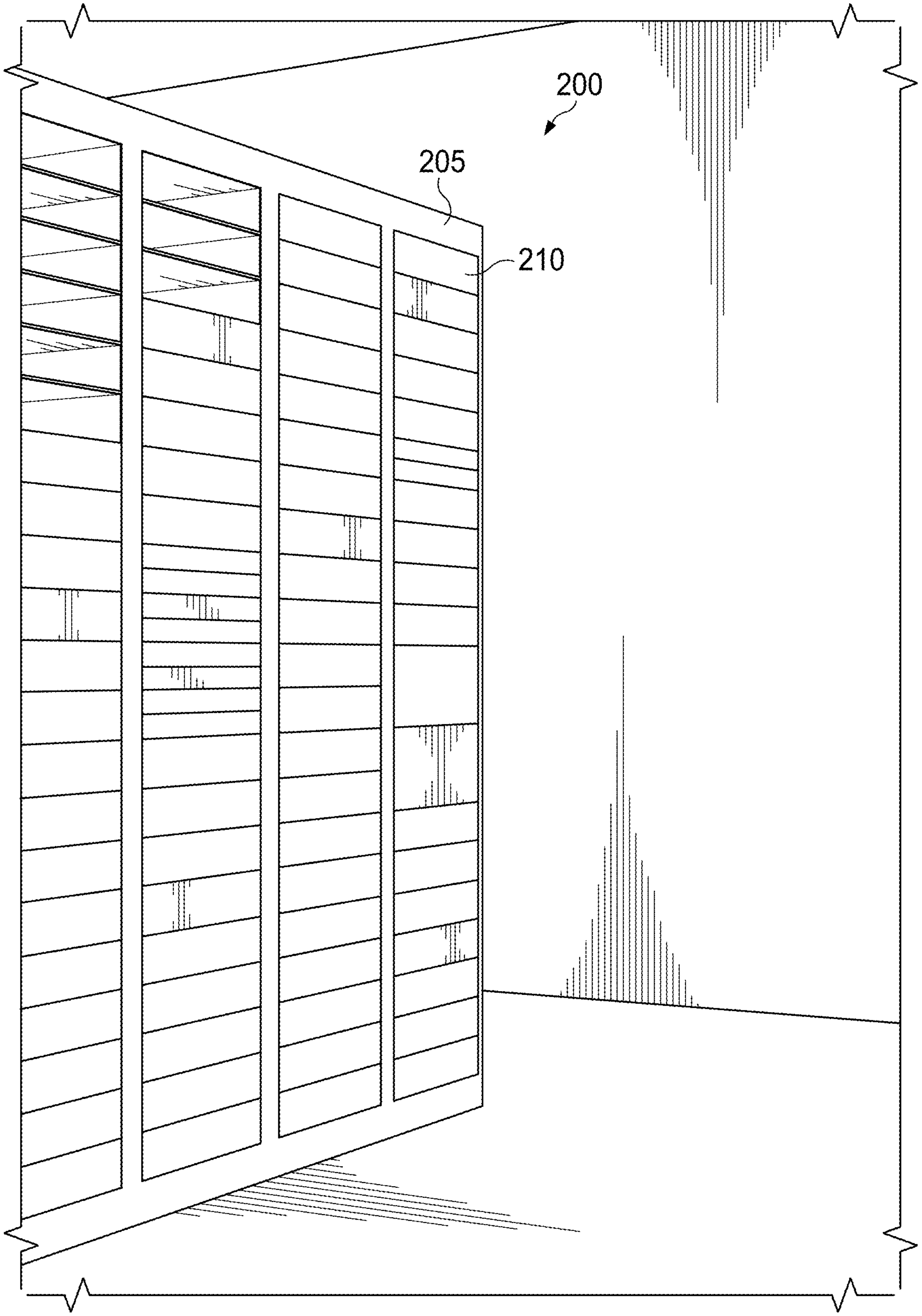
FIG. 2 shows a perspective view of a portion of a data center within an IT environment.

FIG. 2 shows a perspective view of a portion of an IT environment 200. The IT environment includes one or more racks 205 which include a plurality of information handling systems 100, often referred to as a server rack. In various embodiments, the IT environment 200 comprises a data center. As used herein, a data center refers to an IT environment which includes a plurality of networked information handling systems 100. In various embodiments, the information handling systems 100 of the data center include some or all of router type information handling systems, switch type information handling systems, firewall type information handling systems, storage system type information handling systems, server type information handling systems and application delivery controller type information handling systems. In certain environments, the information handling systems 100 are mounted within respective racks. As used herein, a rack refers to a physical structure that is designed to house the information handling systems 100, as well as the associated cabling and power provision for the information handling systems. In certain embodiments, a rack includes side panels to which the information handling systems are mounted. In certain embodiments, the rack includes a top panel and a bottom panel to which the side panels are attached. In certain embodiments, the side panels each include a front side panel and a rear side panel.

In certain embodiments, a plurality of racks is arranged continuous with each other to provide a rack system. An IT environment can include a plurality of rack systems arranged in rows with aisles via which IT service personnel can access information handling systems mounted in the racks. In certain embodiments, the aisles can include front aisles via which the front of the information handling systems may be accessed and hot aisles via which the infrastructure (e.g., data and power cabling) of the IT environment can be accessed.

Each respective rack includes a plurality of vertically arranged information handling systems 210. In certain embodiments, the information handling systems may conform to one of a plurality of standard server sizes. In certain embodiments, the plurality of server sizes conforms to particular rack unit sizes (i.e., rack units). As used herein, a rack unit broadly refers to a standardized server system height. As is known in the art, a server system height often conforms to one of a 1U rack unit, a 2U rack unit, and a 4U rack unit. In general, a 1U rack unit is substantially (i.e., +/−20%) 1.75" high, a 2U rack unit is substantially (i.e., +/−20%) 3.5" high, and a 4U rack height is substantially (i.e., +/−20%) 7.0" high.

Figure 3:
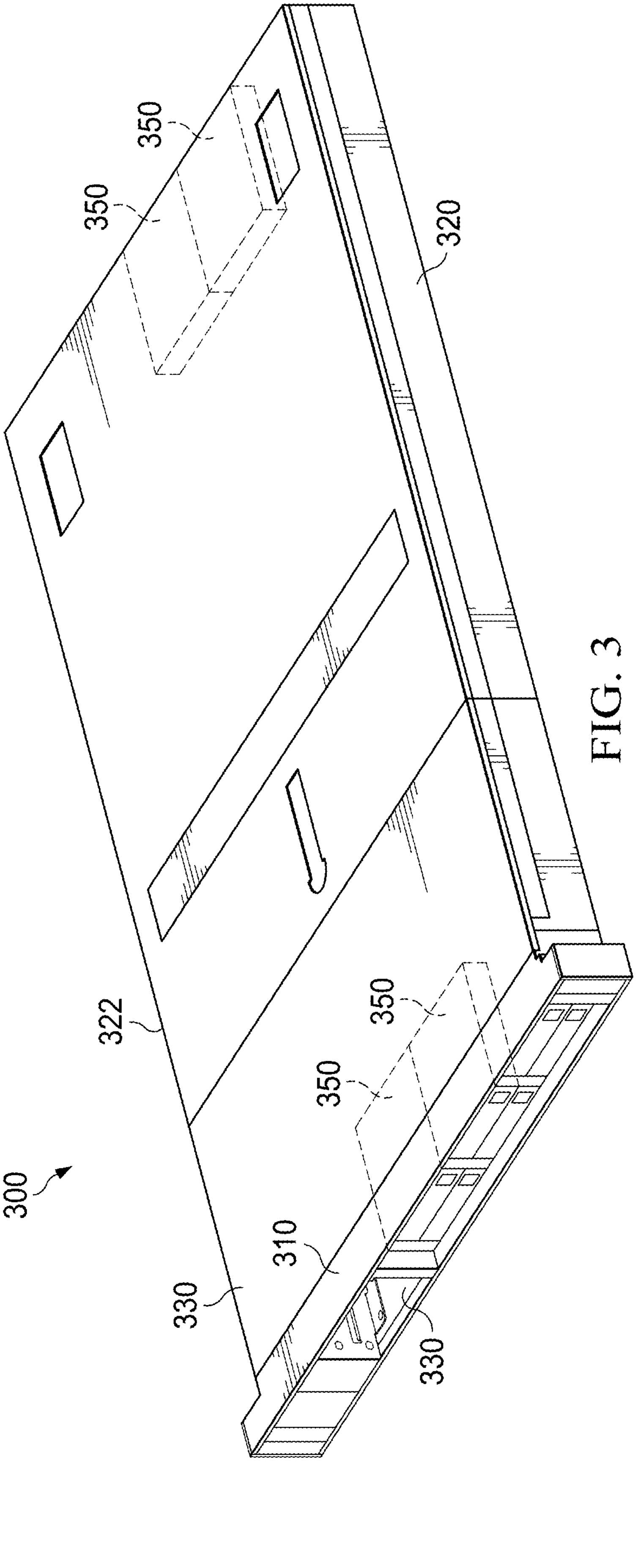
FIG. 3 shows a generalized perspective view of an example server type information handling system.

FIG. 3 shows a generalized perspective view of an example blade server type information handling system 300. In certain embodiments, the server type information handling system includes a front portion 310, which is accessible when the server type information handing system 300 is mounted on a server rack. In certain embodiments, the side portions 320, 322 mount to the rack via respective server mounting components. In certain embodiments, the side portions mount to the rack via respective mechanical guiding features which are mechanically coupled to respective server mounting components. In certain embodiments, the server type information handling system can slide out from the rack via the respective mechanical guiding features. In certain embodiments, internal components of the blade type information handling system 300 may be accessed by removing a top panel 330 of the blade type information handing system 300.

In certain embodiments, the blade type information handing system 300 includes a storage system 350 via which components may be mounted to the blade type information handling system. In certain embodiments, components mounted in one or more of the bays 310 include a storage system 350. In certain embodiments, the storage system 350 corresponds to storage system 150. In certain embodiments, the storage system 350 includes a storage component tray system. In certain embodiments, the storage component tray system includes a storage component cold plug system.

In certain embodiments, the storage component cold plug system includes a storage system cold plug tray component. In certain embodiments, the storage system cold plug tray component includes a cold plug plunger device. In certain embodiments, the cold plug plunger device prevents a storage component from being hot plugged into a chassis of an information handling system. In certain embodiments, the storage system cold plug tray component is configured to mount BOSS storage components, OCP type storage components, or a combination thereof. In certain embodiments, the cold plug plunger device prevents BOSS storage components, OCP type storage components, or a combination thereof, from being hot plugged into a chassis of an information handling system.

In certain embodiments, when installing the storage component cold plug system into a chassis of an information handling system the cold plug plunger device engages with the chassis to stop insertion of the storage component cold plug system. The cold plug plunger device would then need to be activated to allow further insertion of the storage component cold plug system into the chassis. In certain embodiments, a user pulls the cold plug plunger device upwardly to disengage the stop function. Once disengaged, the storage component cold plug system may be fully inserted and physically attached to the chasses. In certain embodiments, the storage component cold plug system can only be installed to a chassis of an information handling system after a top cover of the chassis is opened to provide internal access to the chassis. In certain embodiments, such a storage component cold plug system prevents hot plug damage to storage components of the storage system.

In certain embodiments, the storage component cold plug system provides a storage system tray which may be physically attached to a chassis of an information handling system within the need for a front side thumb-screw. In certain embodiments, the cold plug plunger device enables a storage system tray to be physically attached to a chassis of an information handling system within the need for a front side thumb-screw.

In certain embodiments, the storage system cold plug tray component includes a tray extension. In certain embodiments, the tray extension is included within a base panel of the storage system cold plug tray component. In certain embodiments, the tray extension is integral with the base panel of the storage system cold plug tray component. In certain embodiments, the tray extension includes the cold plug plunger device. In certain embodiments, the cold plug plunger device is physically positioned on the tray extension component to prevent external hot plugging of the storage system cold plug system.

In certain embodiments, the storage system comprises a boot optimized storage system. In certain embodiments, the boot optimized storage system comprises a redundant array of independent disks (RAID) solution optimized for booting an operating system of a server. In certain embodiments, the boot optimized storage system comprises a plurality of serial advanced technology advancement (SATA) solid state devices (SSDs), a host interface (such as a PCIe host interface), a device interface (such as a SATA device interface), or a combination thereof. In certain embodiments, the solid state devices are included within a storage card. In certain embodiments, the storage card corresponds to an M.2 type storage card. In certain embodiments, the storage card corresponds to a boot optimized storage system M.2 type storage card.

Figure 4:
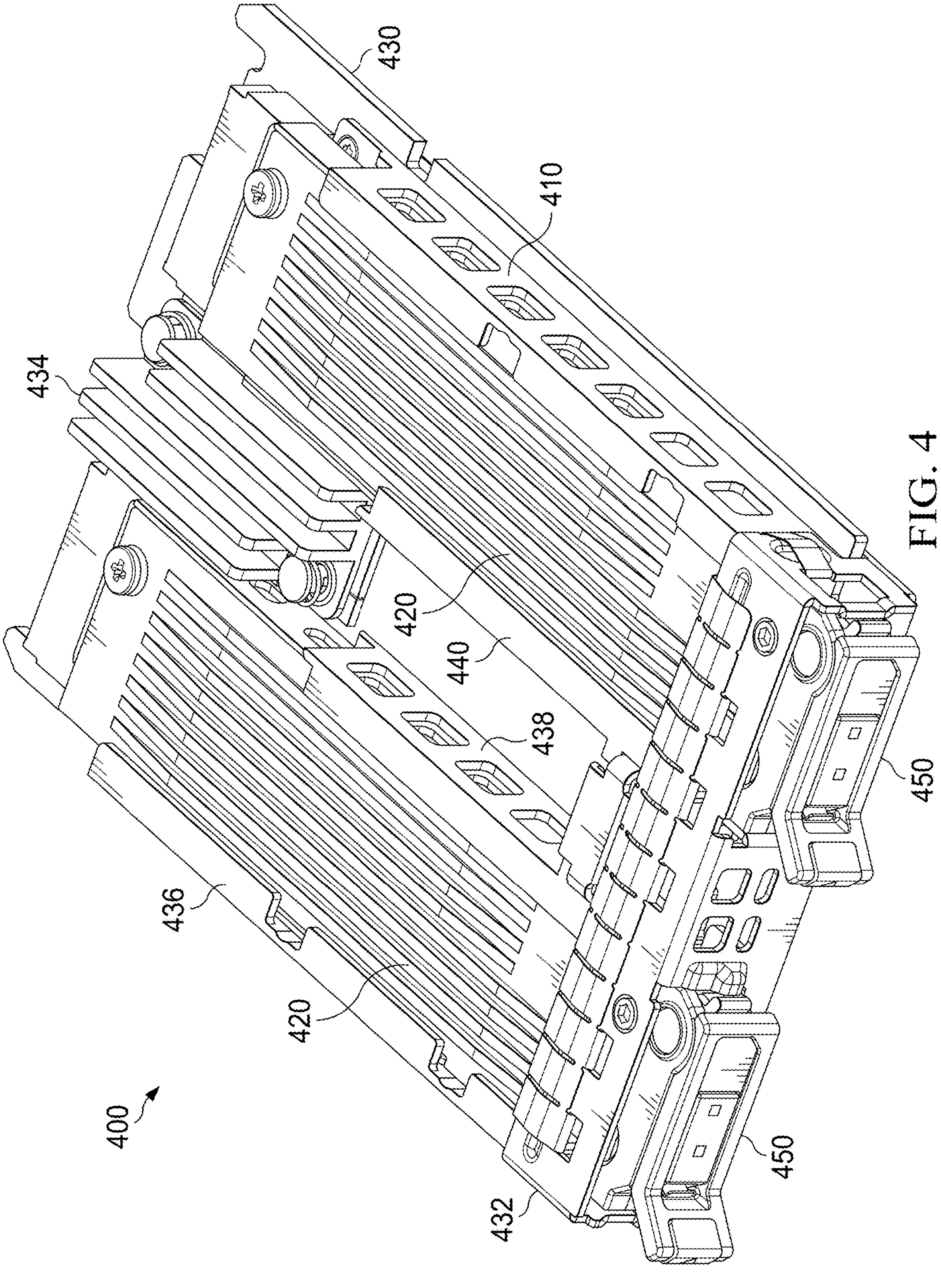
FIG. 4 shows a storage system with a plurality of storage cartridges.

FIG. 4 shows a storage system 400 with a plurality of latching systems 405. In certain embodiments, the storage system 400 corresponds to storage system 150. In certain embodiments, each latching system 405 includes a latching mechanism and a latch engagement portion. In certain embodiments, the storage system 400 corresponds to storage system 150. In certain embodiments, the storage system 400 includes one or more storage cartridge modules 420. In certain embodiments, each storage cartridge module 420 corresponds to a storage component.

In certain embodiments, the storage module housing 410 includes a bottom wall 430, a front housing portion 432, an outside right wall 434, an outside left wall 436, an inside right wall 438, an inside left wall 440, or a combination thereof. In certain embodiments, the housing portion 432 extends substantially perpendicularly (i.e., +/−20%) from the bottom wall 430. In certain embodiments, the front wall extends substantially perpendicularly (i.e., +/−20%) from the bottom wall 430. In certain embodiments, the outside right wall 434 extends substantially perpendicularly (i.e., +/−20%) from the bottom wall 430. In certain embodiments, the outside left wall 436 extends substantially perpendicularly (i.e., +/−20%) from the bottom wall 430. In certain embodiments, the right inside wall 438 extends substantially perpendicularly (i.e., +/−20%) from the bottom wall 430. In certain embodiments, the left inside wall 440 extends substantially perpendicularly (i.e., +/−20%) from the bottom wall 430. It will be appreciated that the orientations of the walls will be reversed when the storage system is installed at the rear of the information handling systems (e.g., the front housing portion 432 is effectively a rear housing portion).

In certain embodiments, the front housing portion 432 defines one or more apertures via which storage cartridge modules 420 may be installed in the storage module housing 410. In certain embodiments, pairs of left and right walls (e.g., a left outside wall and a right inside wall) include channels via which respective storage cartridges may be inserted and mounted to the storage module housing 410. In certain embodiments, the left and right walls include channels via which respective storage cartridges may be inserted and mounted to the storage module housing 410. In certain embodiments, the outside right wall 434 and the inside left wall 440 define channels via which a storage cartridge module 420 may be installed in the storage module housing 410. In certain embodiments, the outside left wall 436 and the inside right wall 438 define channels via which a storage cartridge module 420 may be installed in the storage module housing 410.

Figure 5:
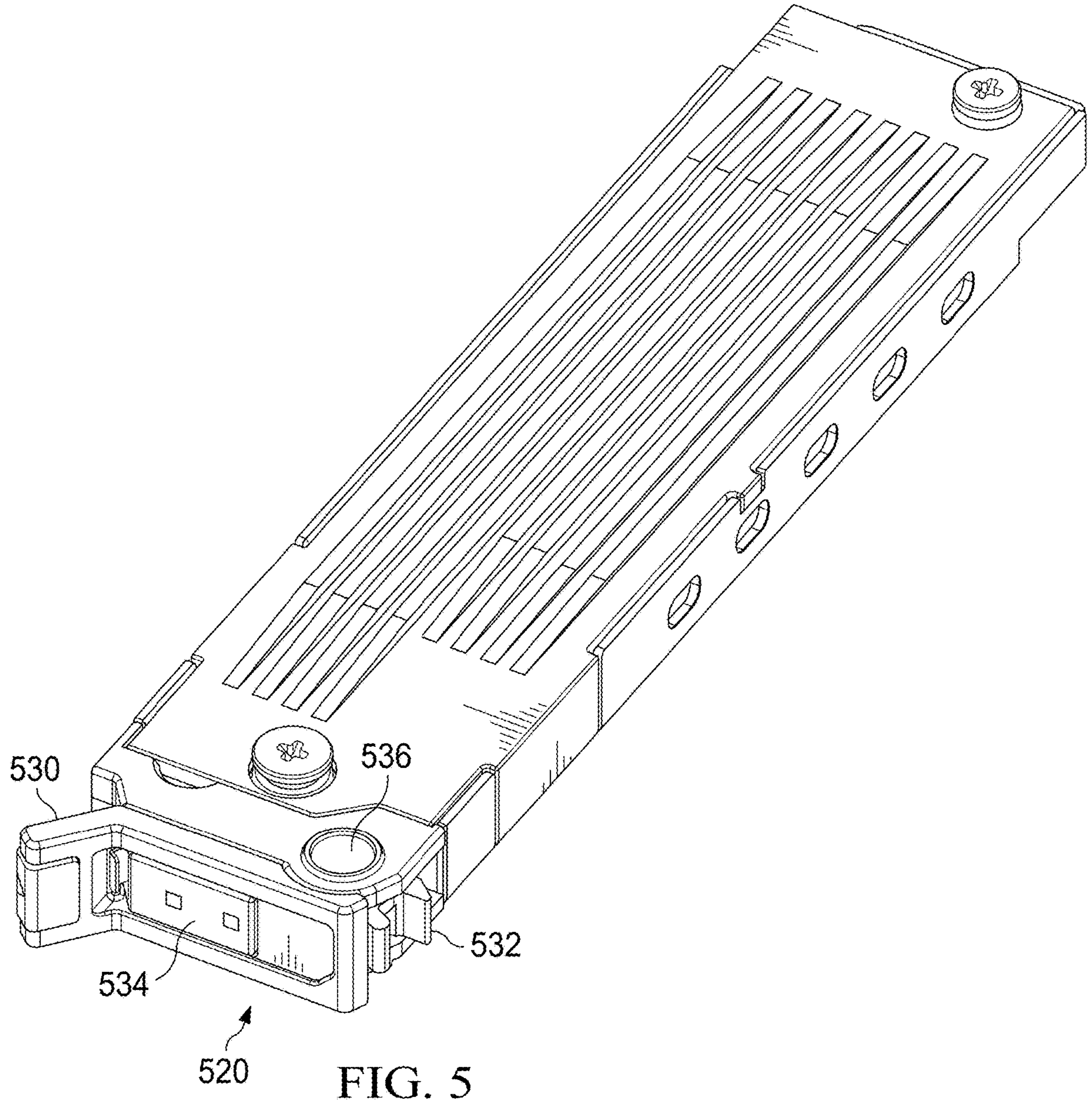
FIG. 5 shows a perspective view of a storage cartridge of a storage system.

FIG. 5 shows a perspective view of a storage cartridge module 500 (also referred to as a storage module or a storage component) of a storage system. In certain embodiments, the storage cartridge module 500 corresponds to storage cartridge module 420. In certain embodiments, the storage system corresponds to storage system 150.

In certain embodiments, the storage cartridge module 500 includes a bottom component 510 and a top cover 512. In certain embodiments, the bottom component 510 and the top cover 512 are configured to receive a latch component 530. In certain embodiments, the bottom component 510 defines an attachment aperture, includes an attachment component, or a combination thereof. In certain embodiments, the attachment component includes a nut. In certain embodiments, the attachment aperture, the attachment component, or a combination thereof, are used to attach a latch component 530 to the storage cartridge module 500. In certain embodiments, the attachment component mates with a fastener to mount the top cover 512 to the bottom component 510.

In certain embodiments, a latch mechanism includes a latch hook portion 532. In certain embodiments, the latch 530 and the latch hook portion 532, or a combination thereof are included within a latch mechanism. In certain embodiments, the latch hook portion 532 is configured to interact with a latch engagement portion.

Figure 6A:
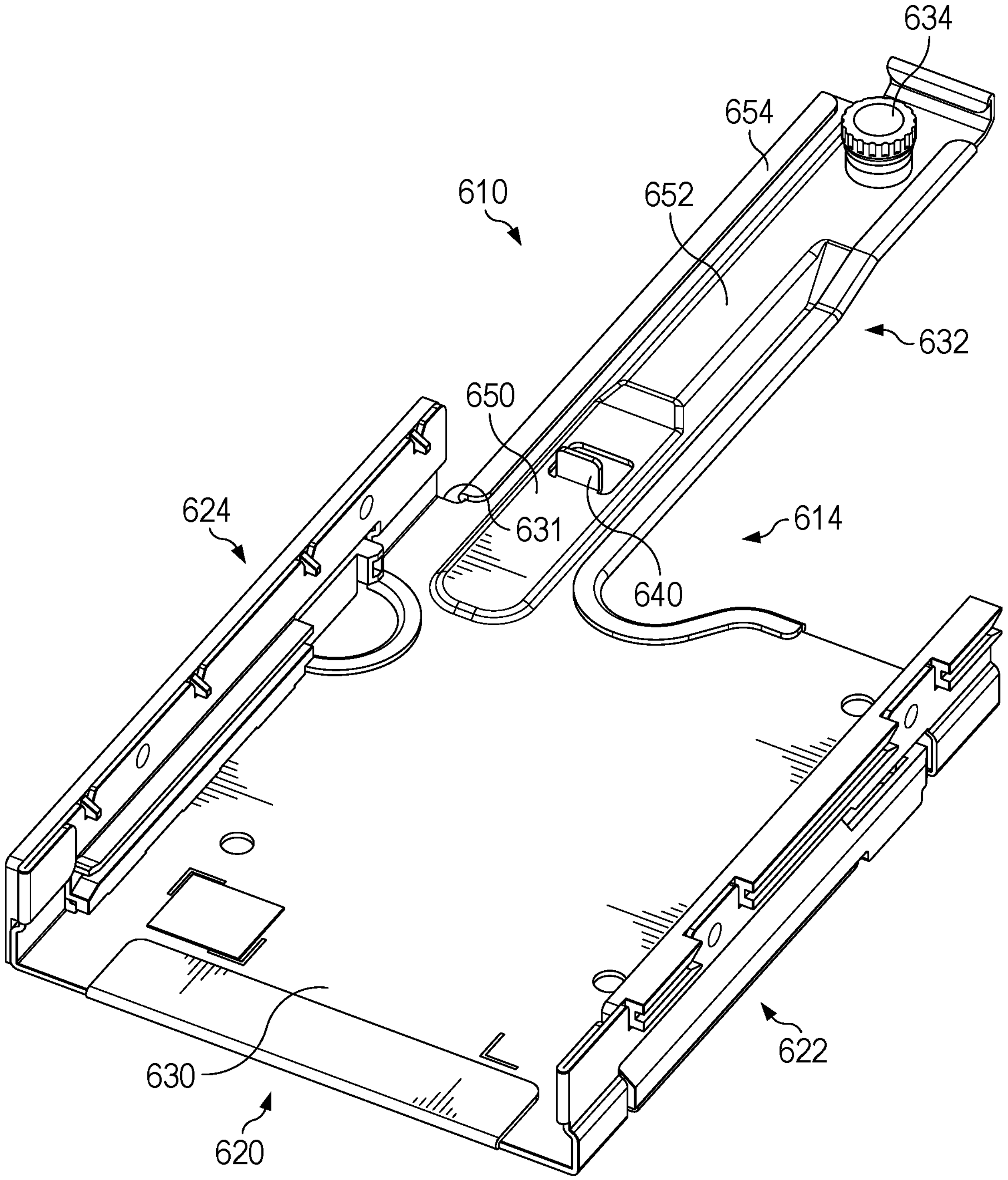
FIGS. 6A, 6B, 6C, 6D, 6E, 6F, and 6G, generally referred to as FIG. 6, show a plurality of views of a storage system.
Figure 6B:
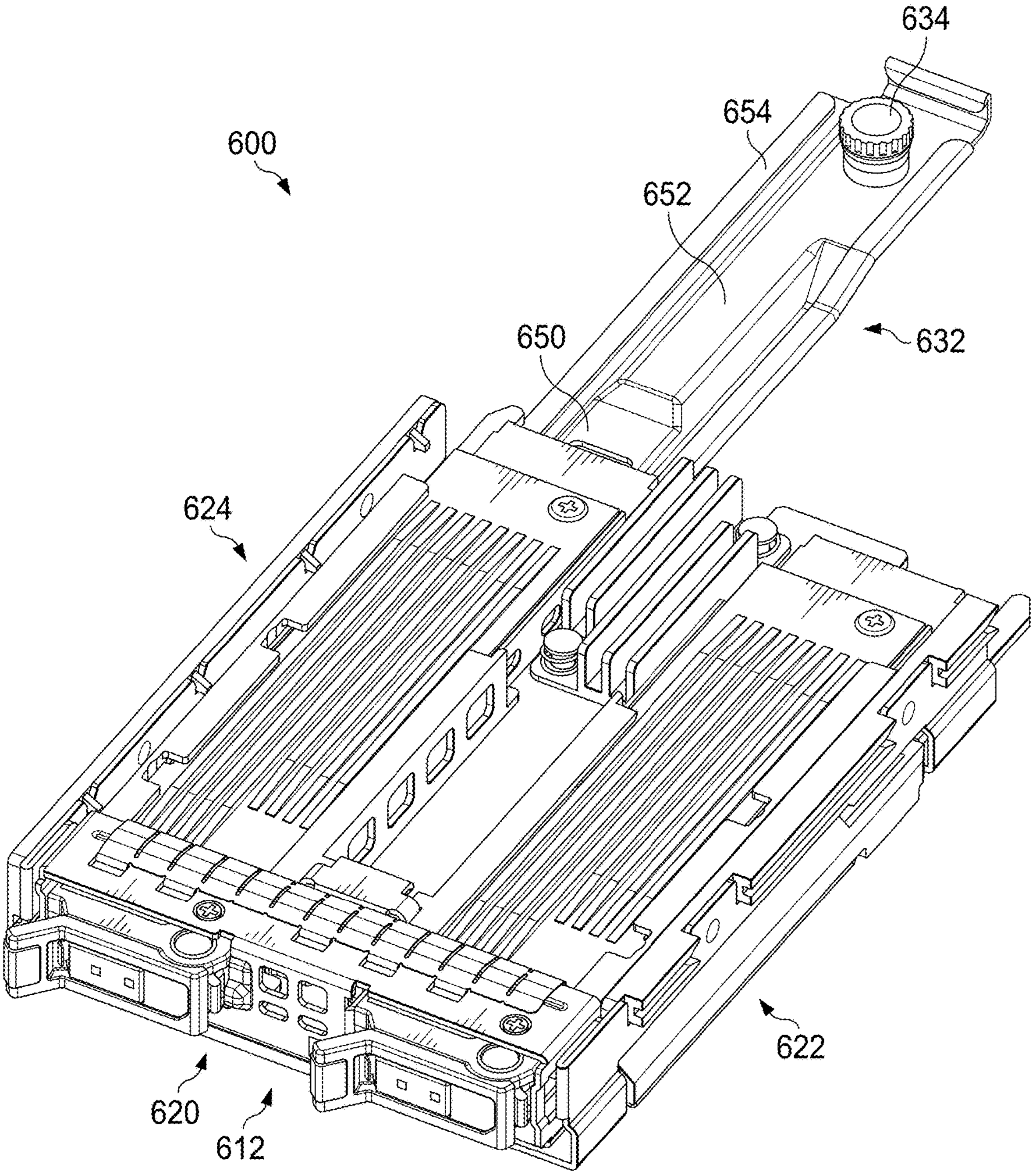
Figure 6C:
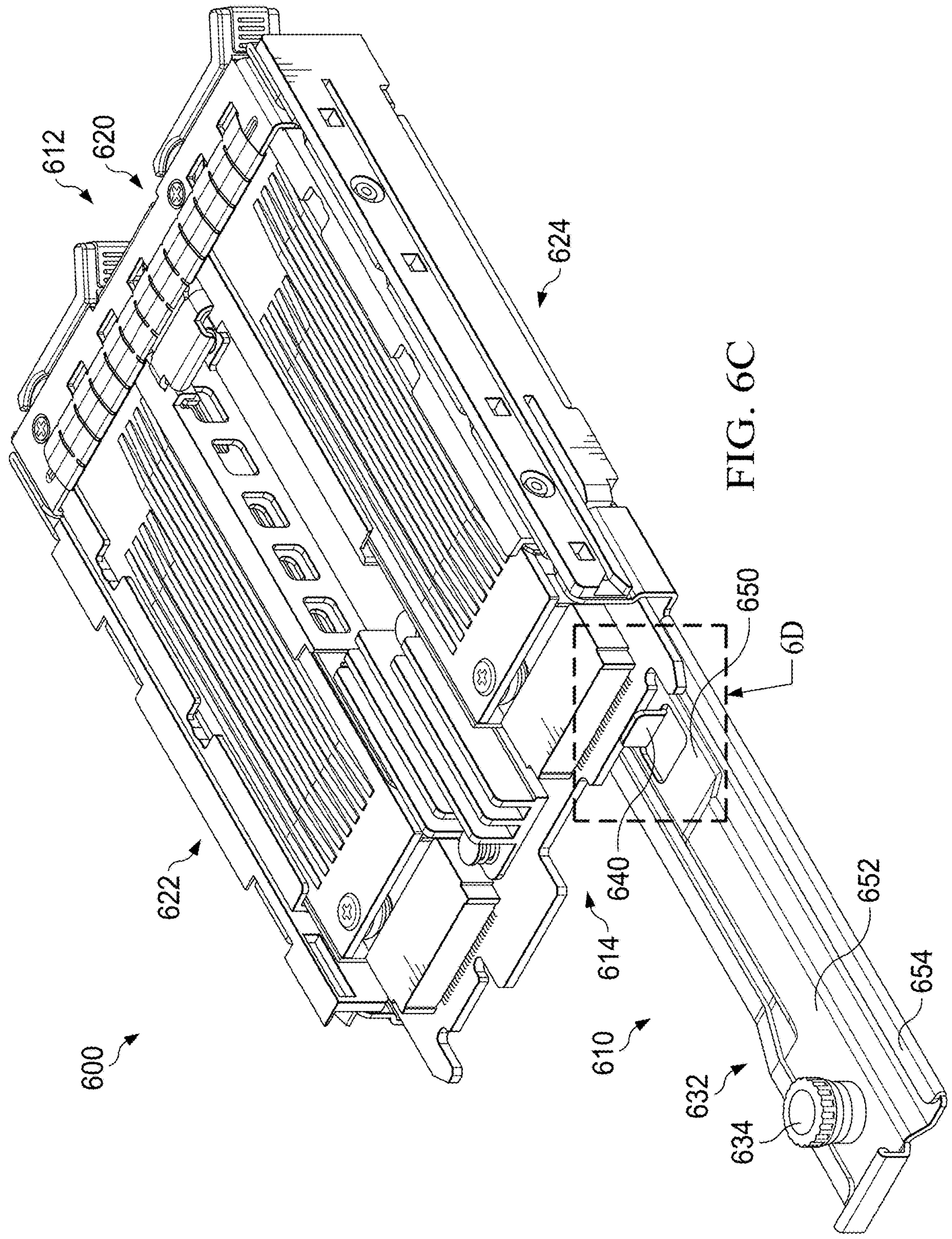
Figure 6D:
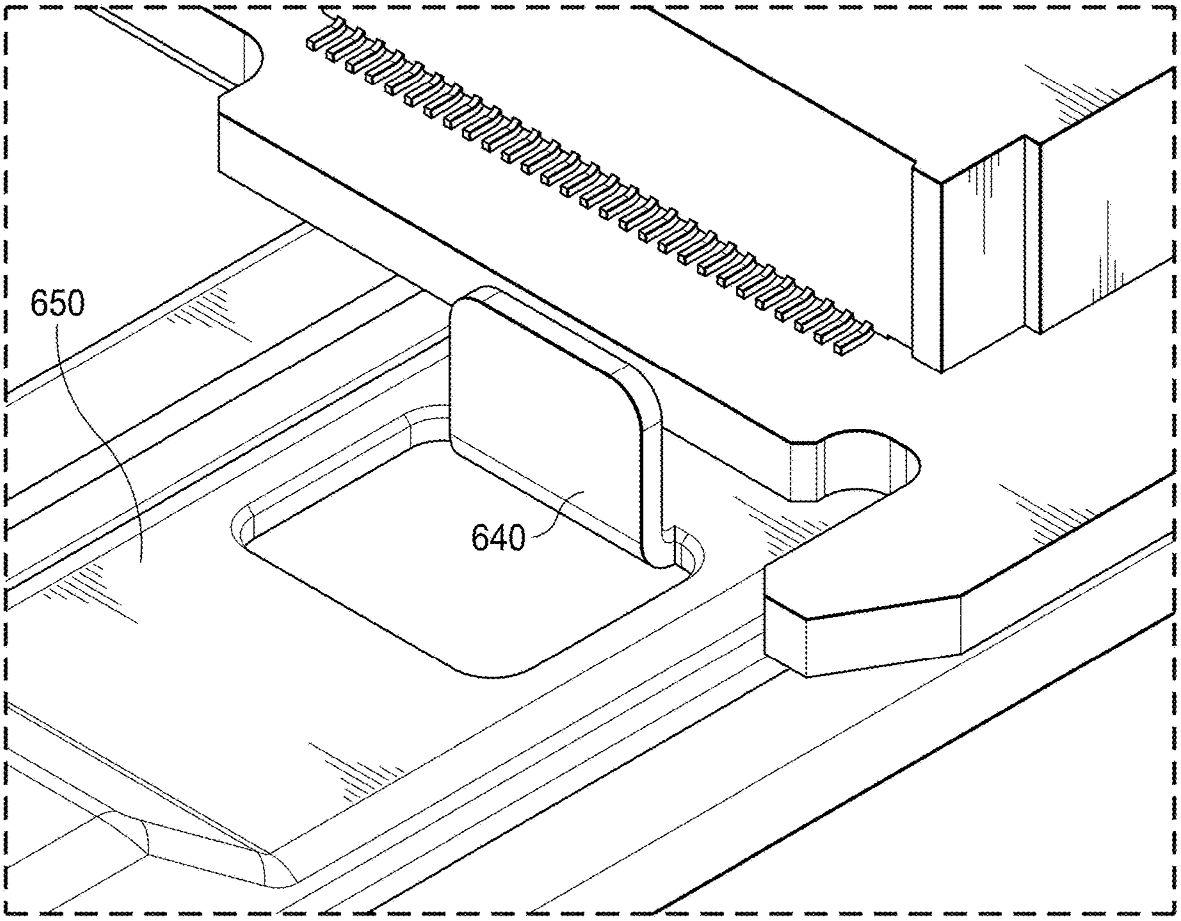
Figure 6E:
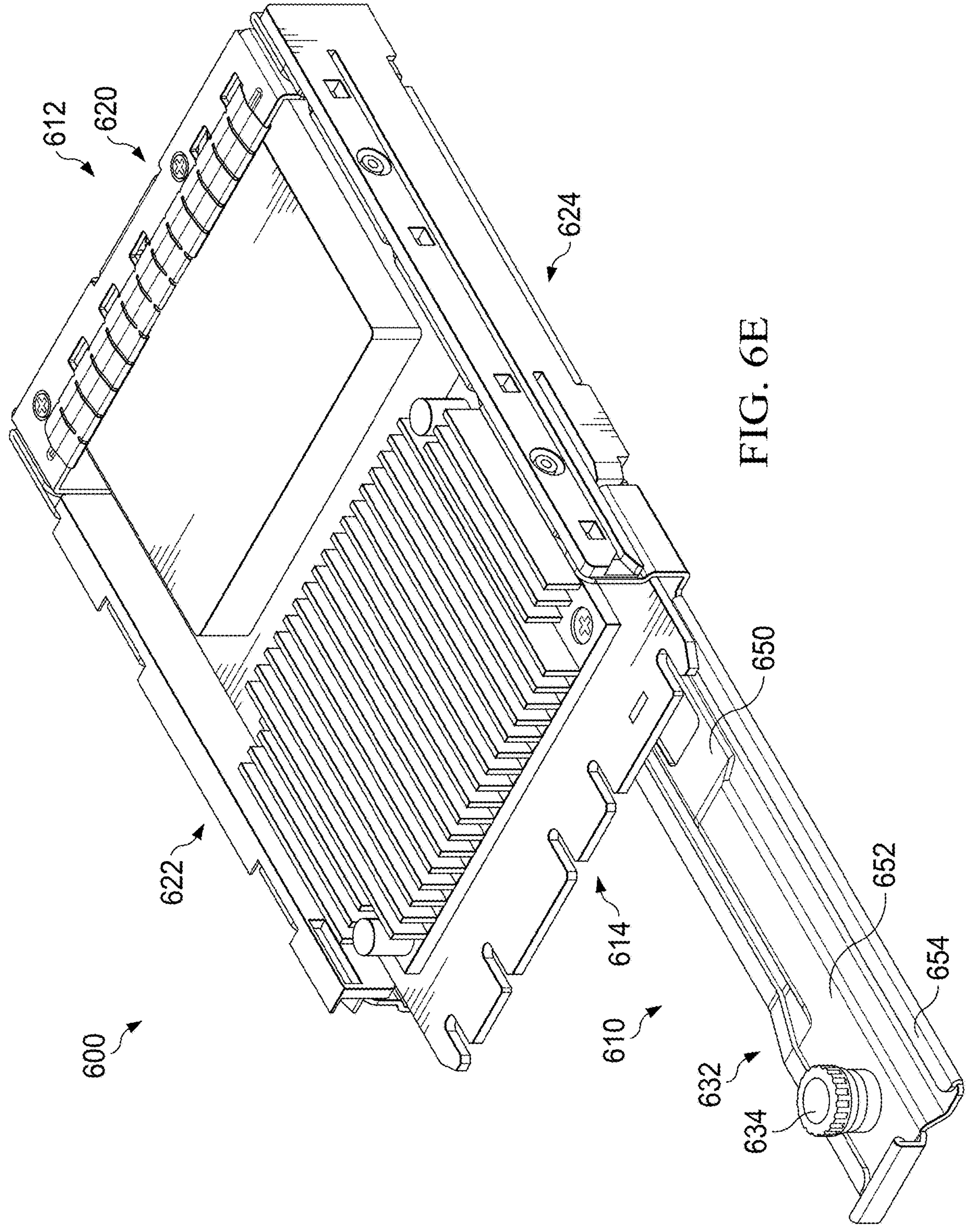
Figure 6G:
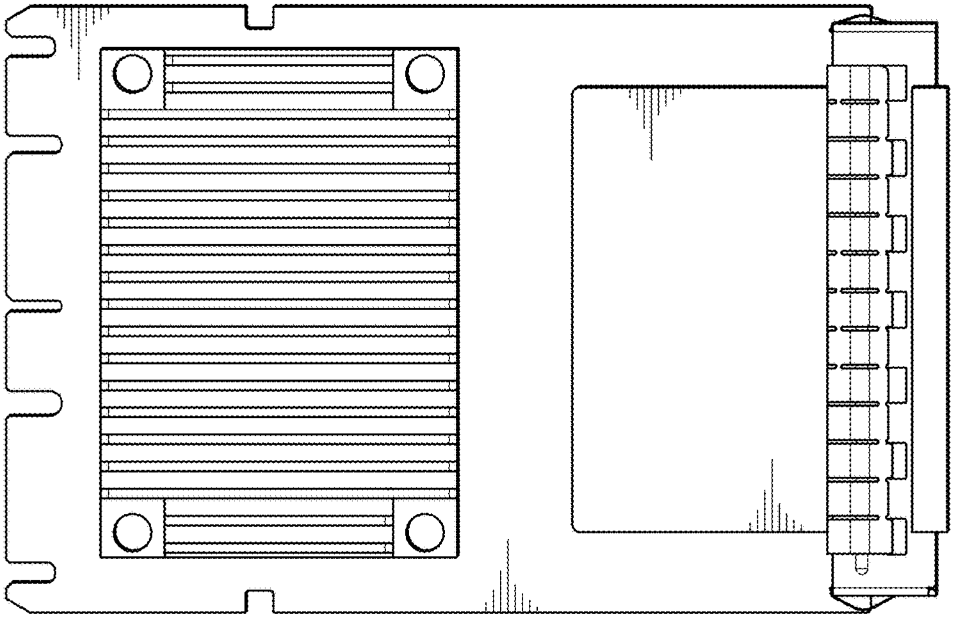
Figure 6F:
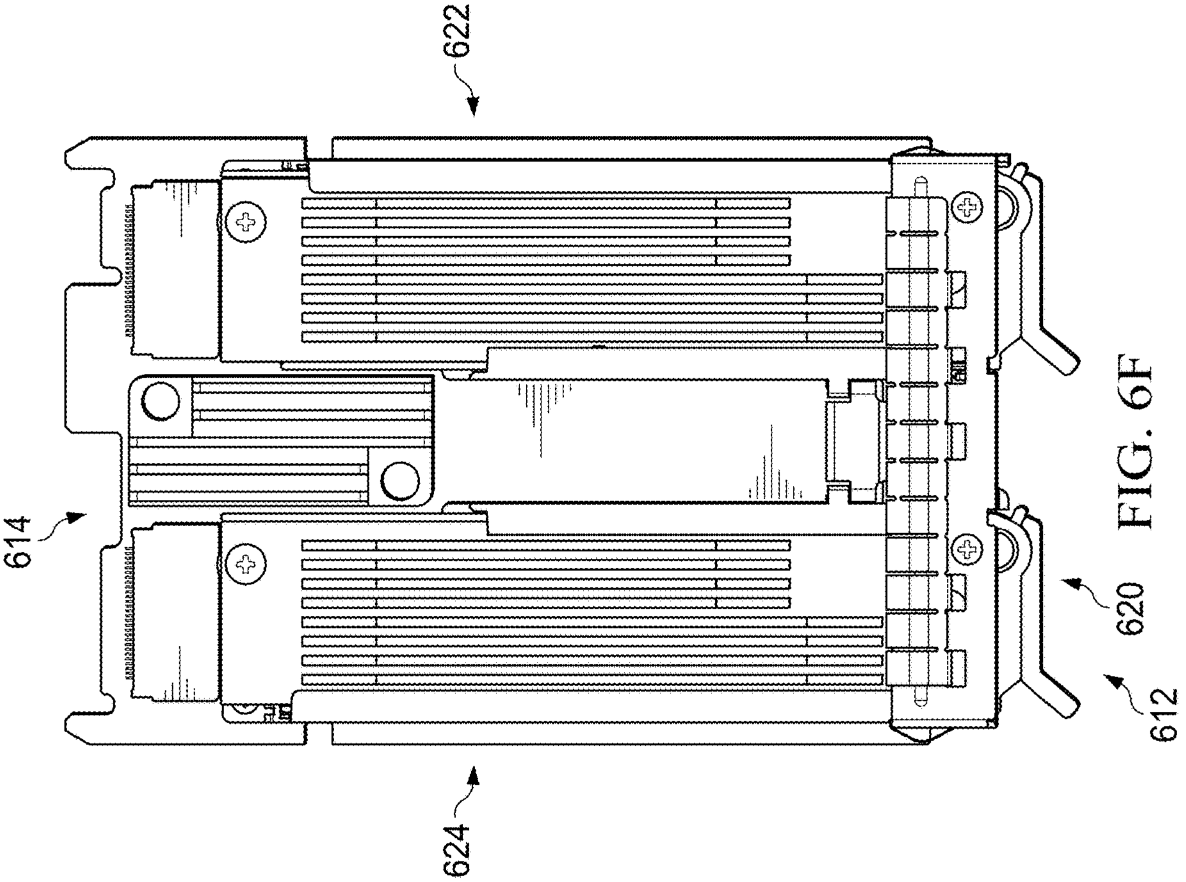

FIGS. 6A, 6B, 6C, 6D, 6E, 6F and 6G, generally referred to as FIG. 6, show a plurality of views of a storage system 600. More specifically, FIG. 6A shows a perspective view of a storage system tray system 610. FIG. 6B shows a front perspective view of storage system in which a storage component system is mounted within a storage system tray. FIG. 6C shows rear perspective view of storage system in which a storage component system is mounted within a storage system tray. FIG. 6D shows a perspective view of a portion of tray extension of a storage system tray of a storage system. FIG. 6E shows a front perspective view of storage system in which another type of storage component system is inserted into a storage system tray. FIG. 6F shows a top view of a first type of storage component system. FIG. 6G shows a top view of a second type of storage component system. In certain embodiments, the storage system 600 includes a storage system tray system 610. In certain embodiments, the storage system tray system 610 is configured to mount a BOSS type storage system 612.

In certain embodiments, the storage system tray system 610 includes a storage system tray 614 as well as one or more storage system mounting components attached to the storage system tray. In certain embodiments, the storage system tray system 610 includes a base panel component 620, a right wall portion 622, a left wall portion 624, or a combination thereof. In certain embodiments, the right wall portion 622 extends substantially perpendicularly (i.e., +/−20%) from the base panel component 620. In certain embodiments, the left wall portion 624 extends substantially perpendicularly (i.e., +/−20%) from the base panel component 620. It will be appreciated that the orientations of the walls will be reversed when the storage system is installed at the rear of the information handling systems (e.g., the right wall portion 622 is effectively a left wall portion). In certain embodiments, the right wall portion 622 includes interior guile slots, exterior guide slots, or a combination thereof. In certain embodiments, the left wall portion 624 includes interior guile slots, exterior guide slots, or a combination thereof.

In certain embodiments, the base panel component 620 includes a base panel portion 630 and a tray extension 632. In certain embodiments, the tray extension 632 extends substantially horizontally (i.e., +/−20%) from the base panel portion 630. In certain embodiments, the tray extension 632 is configured as an arm extending substantially horizontally (i.e., +/−20%) from the base panel portion 630. In certain embodiments, the tray extension 632 extends from a rear edge 631 of the base panel portion 630. In certain embodiments, a width of the tray extension 632 is less than a width of the base panel portion 630. In certain embodiments, the tray extension 632 extends close (i.e., 0.05 cm+/−20%) to a side edge of the rear edge 631 of the base panel portion 630. In certain embodiments, the tray extension 632 is integral with the base panel portion 630 of the storage system tray component 610. In certain embodiments, the base panel portion 630 and the tray extension 632 are integrated as a single component. In certain embodiments, the tray extension is configured to perform a cold plug function. As used herein, a cold plug function broadly refers to preventing hot plugging of a storage component to an information handling system. As used herein, hot plugging (also referred to as hot swap or hot insertion) broadly refers to the process of adding or removing a storage component to the information handling system while the system is still running.

In certain embodiments, the tray extension includes the cold plug plunger device 634. In certain embodiments, the cold plug plunger device 634 is physically positioned on the tray extension component 632 to prevent external hot plugging of the storage system cold plug system. In certain embodiments, the cold plug plunger device 634 prevents a storage component from being hot plugged into a chassis of an information handling system. In certain embodiments, the cold plug plunger device prevents BOSS storage components from being hot plugged into a chassis of an information handling system.

In certain embodiments, when installing the storage system 600 into a chassis of an information handling system the cold plug plunger device 634 engages with the chassis to provide a stop function which prevents further insertion of the storage system 600. The cold plug plunger device 634 would then need to be activated to allow further insertion of the storage system 600 into the chassis. In certain embodiments, a user pulls the cold plug plunger device 634 upwardly to disengage the stop function. Once disengaged, the storage system 600 may be fully inserted and physically attached to the chassis. In certain embodiments, the storage system 600 can only be installed to a chassis of an information handling system after a top cover of the chassis is opened to provide internal access to the chassis. In certain embodiments, such a storage system 600 prevents hot plug damage to storage components of the storage system.

In certain embodiments, the tray extension 634 includes a stop projection 640. In certain embodiments, the stop projection 640 extends substantially perpendicularly (i.e., +/−20%) from the tray extension 632. In certain embodiments, the stop projection 640 includes a bend which extends from the tray extension 632. In certain embodiments, the bend extends substantially perpendicularly (i.e., +/−20%) from the tray extension 634. In certain embodiments, the stop projection 640 prevents installation of an OCP type component into the storage system tray system 610. In certain embodiments, the stop projection 640 is positioned to stop insertion of a BOSS type storage system. In certain embodiments, the stop projection 640 is positioned to stop insertion of a BOSS type storage system when the BOSS type storage system is fully inserted within the storage system tray system 610. In certain embodiments, the stop projection 640 is positioned to interact with an indented portion of a base of a BOSS type storage system (see e.g., FIGS. 6C and 6F). In certain embodiments, the stop projection 640 is positioned to interact with an extended portion of a base of an OCP type storage system (see e.g., FIGS. 6E and 6G).

In certain embodiments, the tray extension 632 includes a first raised portion 650, a second raised portion 652, an edge structure 654, or a combination thereof. In certain embodiments, the stop projection 640 is positioned on the first raised portion 650. In certain embodiments, the second raised portion 652 defines a plunger aperture through which the plunger device 634 is mounted. In certain embodiments, the second raised portion 652 includes a corresponding interior raised edge 660. In certain embodiments, the edge structure 654 extends along an outside edge of the tray extension. In certain embodiments, the edge structure 654 extends along an outside edge contiguous with a portion of the first raised portion 650. In certain embodiments, the edge structure 654 extends along an outside edge contiguous with a portion of the second raised portion 652.

Figure 7:
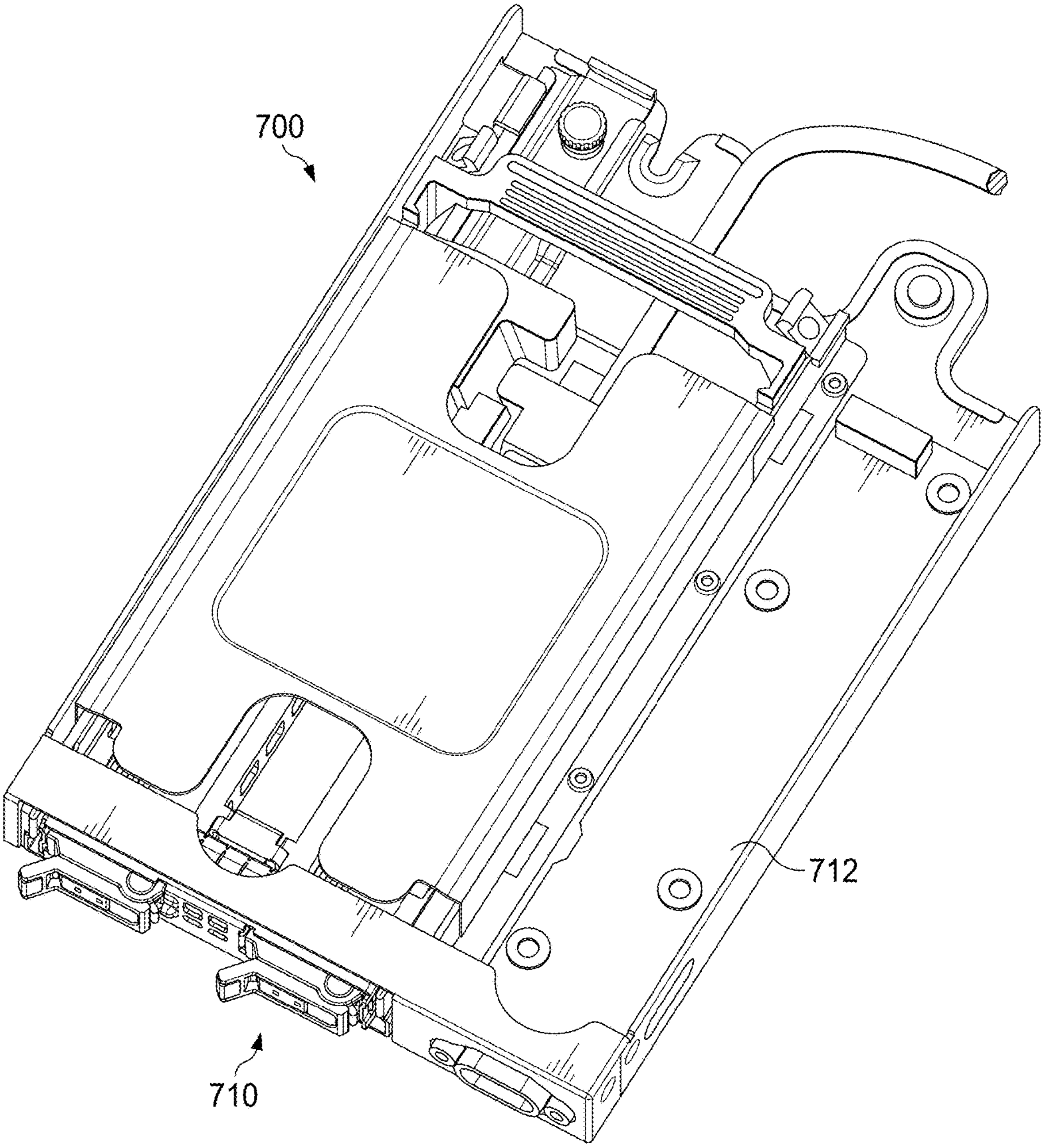
FIG. 7 shows a perspective view of a storage system mounted within a storage component tray system.

FIG. 7 shows a perspective view of a storage system mounted within a storage component tray system 700. More specifically, FIG. 7 shows a perspective view of a storage component cold plug system 710 which is mounted within an OCP type tray system 712. In certain embodiments, such a storage component cold plug system 710 mounted within an OCP type tray system 712 may be mounted in server storage systems which conform to particular rack unit sizes. In certain embodiments, such a storage component cold plug system 710 mounted within an OCP type tray system 712 may be mounted in server storage systems which conform to a 2U rack unit server system height.

Figure 8A:
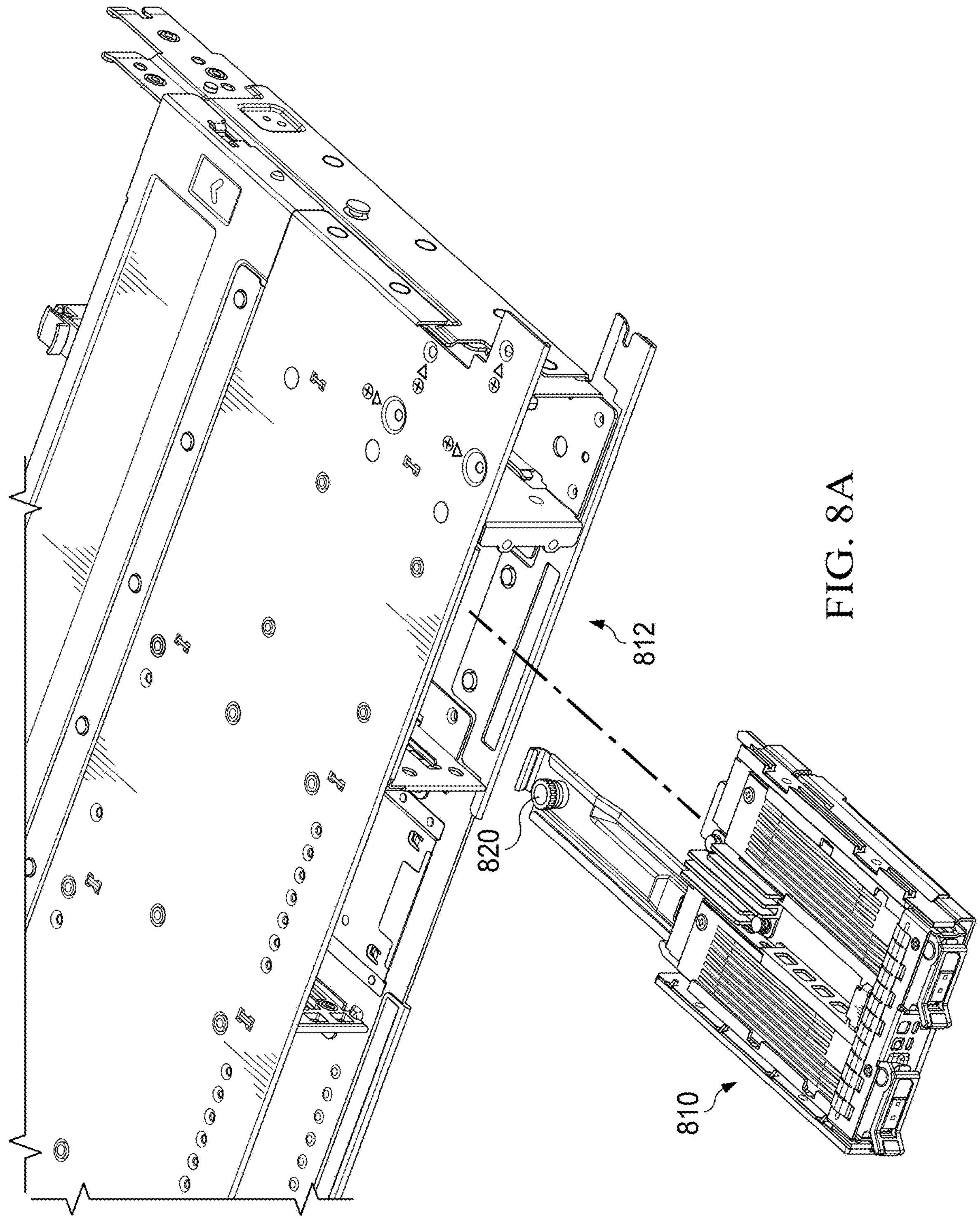
FIGS. 8A, 8B, 8C and 8D, generally referred to as FIG. 8, show a plurality of views of installation of a storage module to a storage component tray system.
Figure 8B:
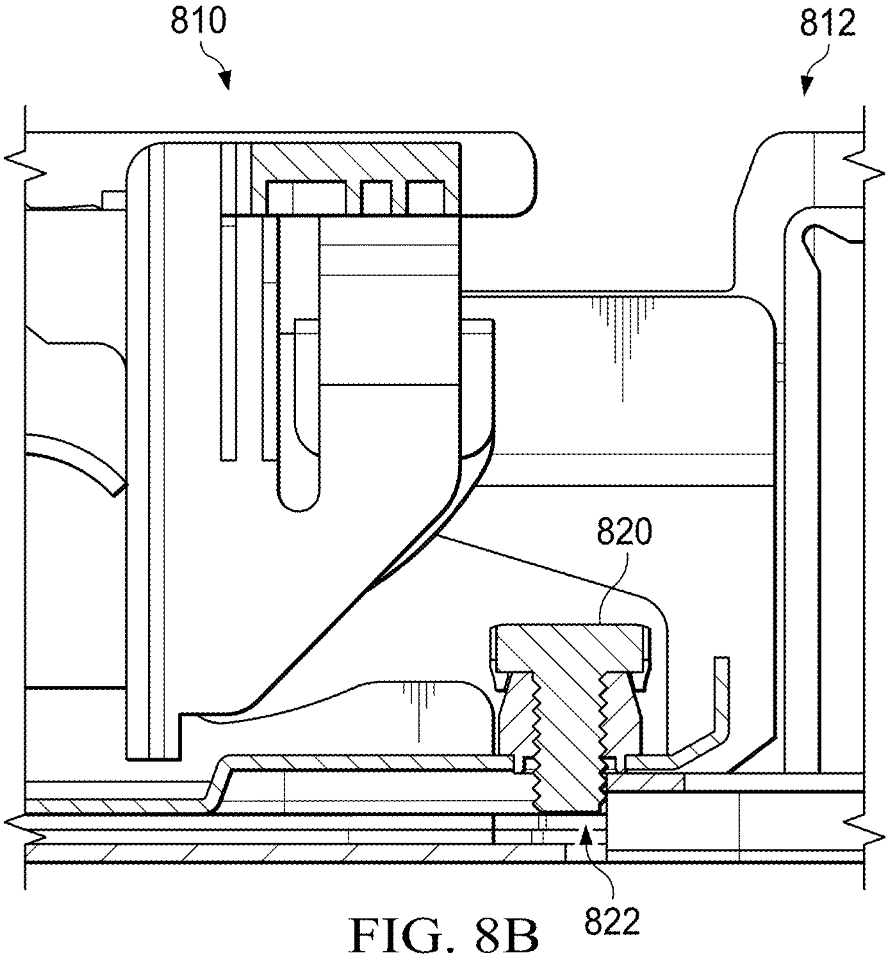
Figure 8C:
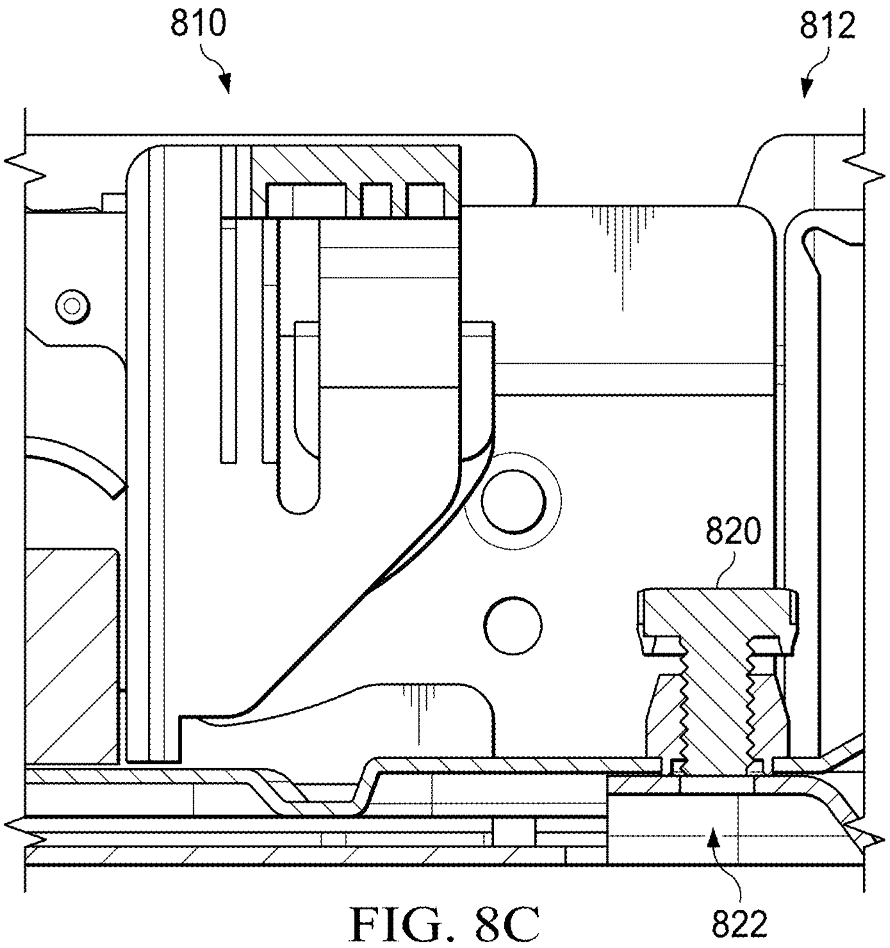
Figure 8D:
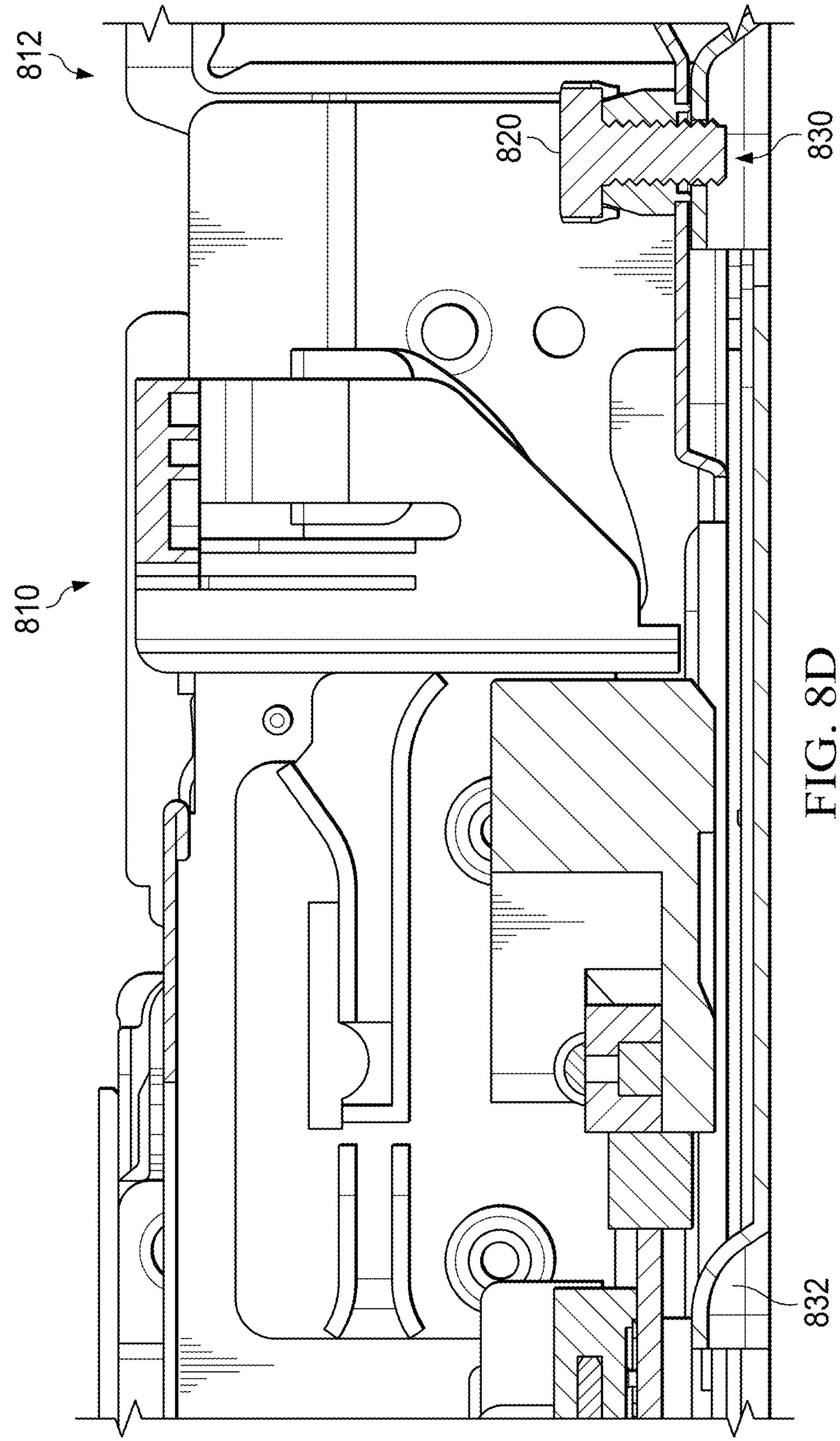

FIGS. 8A, 8B, 8C and 8D, generally referred to as FIG. 8, show a plurality of views of installation of a storage module to a storage component tray system. More specifically, FIG. 8A shows a perspective front view of storage system and a portion of an information handling system. FIG. 8B shows a side view of a portion of a storage system and a portion of an information handing system when the storage system is located at a first installation position. FIG. 8C shows a side view of a portion of a storage system and a portion of an information handing system when the storage system is located at a second installation position. FIG. 8D shows a side view of a portion of a storage system and a portion of an information handing system when the storage system is located at a third installation position.

More specifically, a storage system 810 may be installed into storage system slot 812 of a chassis 814 of an information handing system from an external location (see e.g., FIG. 8A). As the storage system 810 is inserted into the slot 812, a plunger device 820 interacts with a first stop 822 located within the information handling system chassis (see e.g., FIG. 8B). In certain embodiments, the first stop 822 is configured as an indentation into which the plunger device projects as the storage system 810 is inserted into the slot 812. Next, the plunger device 820 is activated to allow further insertion of the storage system 810 into the chassis. In certain embodiments, the plunger device is activated when a user pulls the plunger device 820 upwardly. In certain embodiments, activating the plunger device 820 disengages the first stop 822 (see e.g., FIG. 8C).

Next, the storage system 810 is further inserted into the chassis. In certain embodiments, when the storage system 810 is fully inserted, the storage system 810 interacts with a stop projection 832 which extends from the chassis of the information handling system. In certain embodiments, interaction of the storage system 810 with the stop projection 832 informs a user to release the plunger device 820. In certain embodiments, when the storage system 810 interacts with a stop projection 832, the plunger device 820 is positioned to align with the lock portion 830. When the storage system 810 is fully inserted, the plunger device 820 is released to engage with the lock portion 830 (see e.g., FIG. 8D). In certain embodiments, the lock portion 830 is configured as an indentation into which the plunger device 820 projects. In certain embodiments, engaging with plunger device 820 with the lock portion 830 locks the storage system 810 in place. In certain embodiments, the plunger device 820 locks the storage system 810 in place until the plunger device 820 is again activated. In certain embodiments, the plunger device 820 interacting with the lock portion 830 enables a storage system 810 to be physically attached to a chassis of an information handling system within the need for a front side thumb-screw.

Figure 9A:
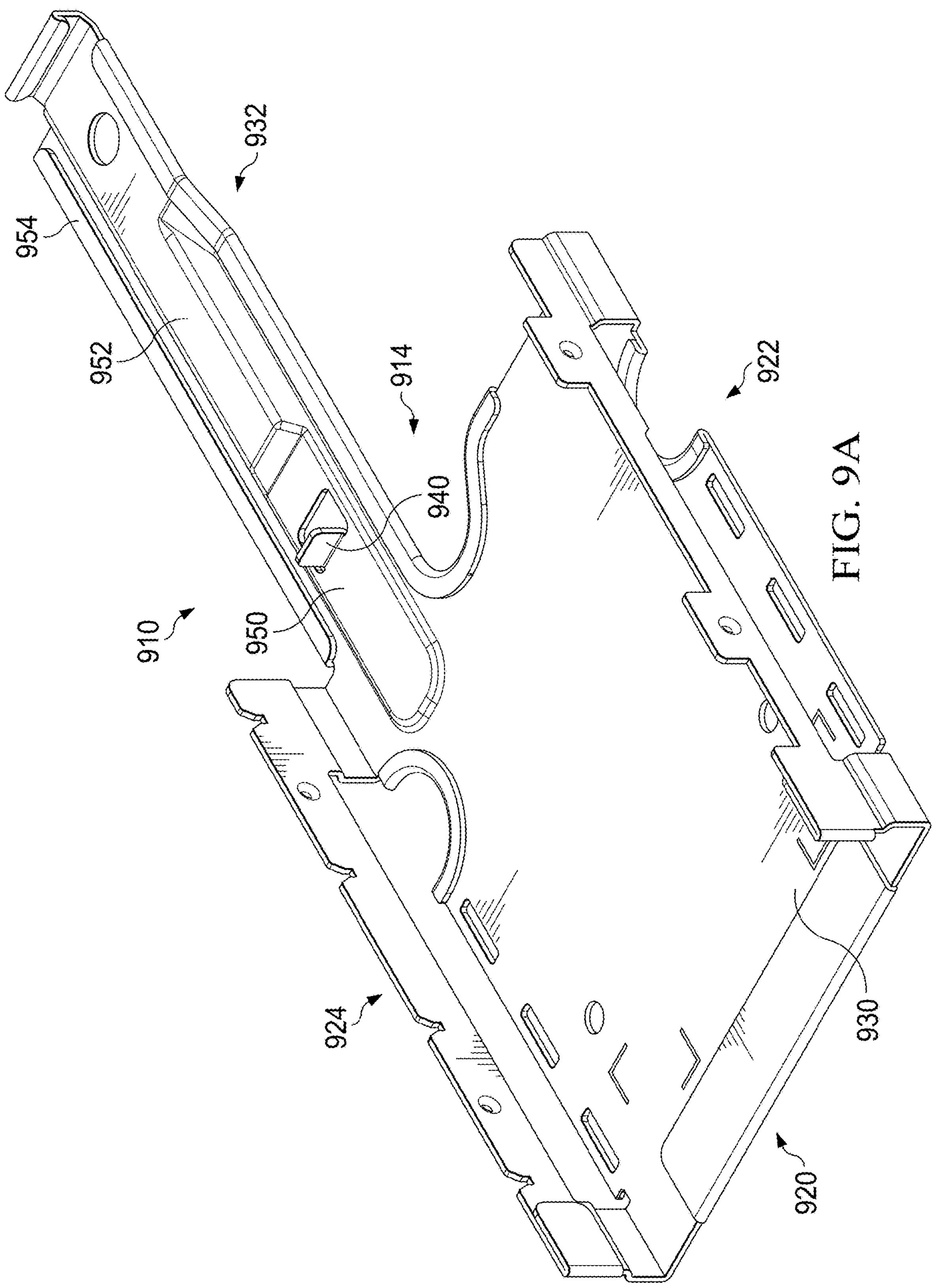
FIGS. 9A, 9B, 9C, 9D, 9E, 9F and 9G, generally referred to as FIG. 9, show a plurality of views of a storage component tray component.
Figure 9B:
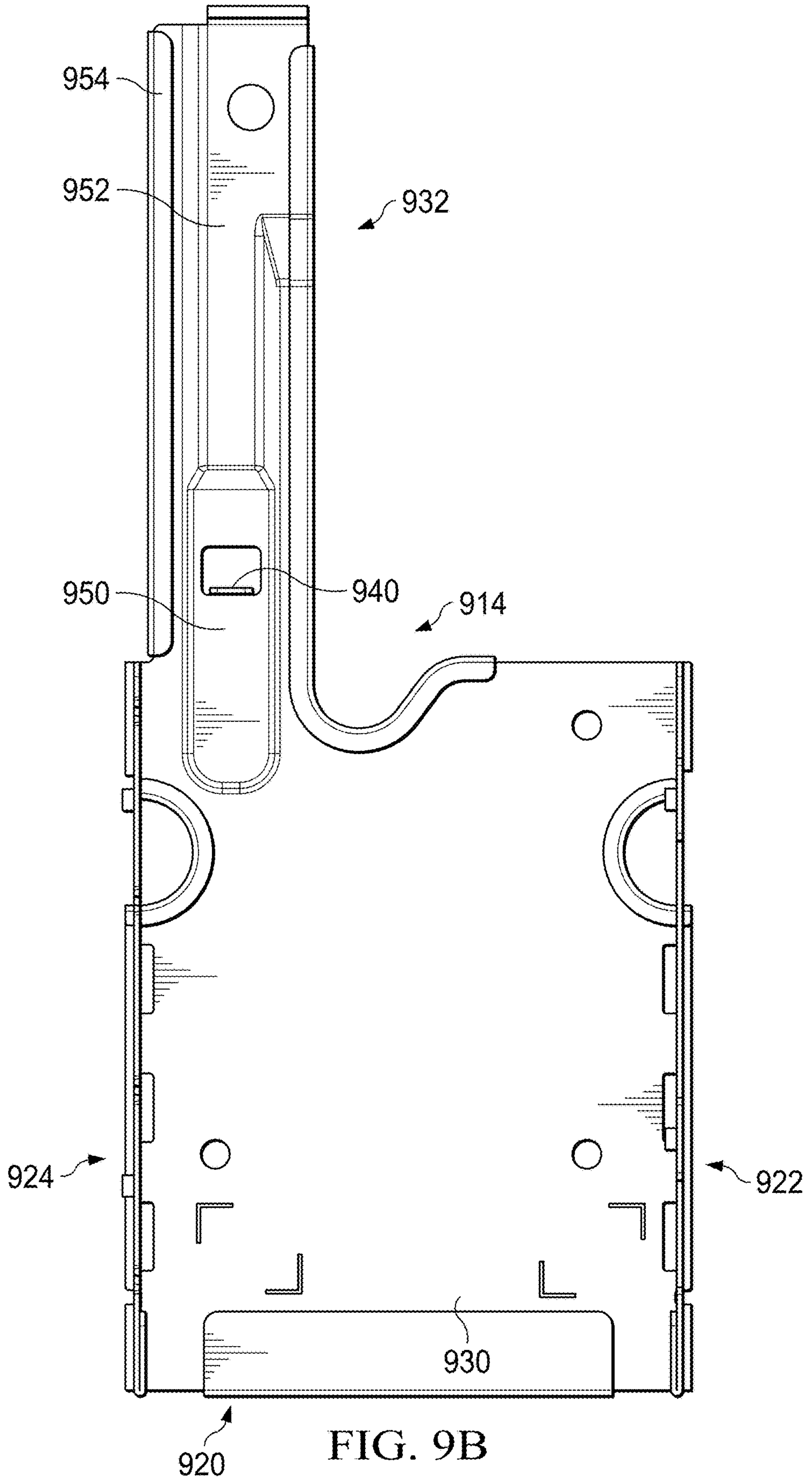
Figure 9C:
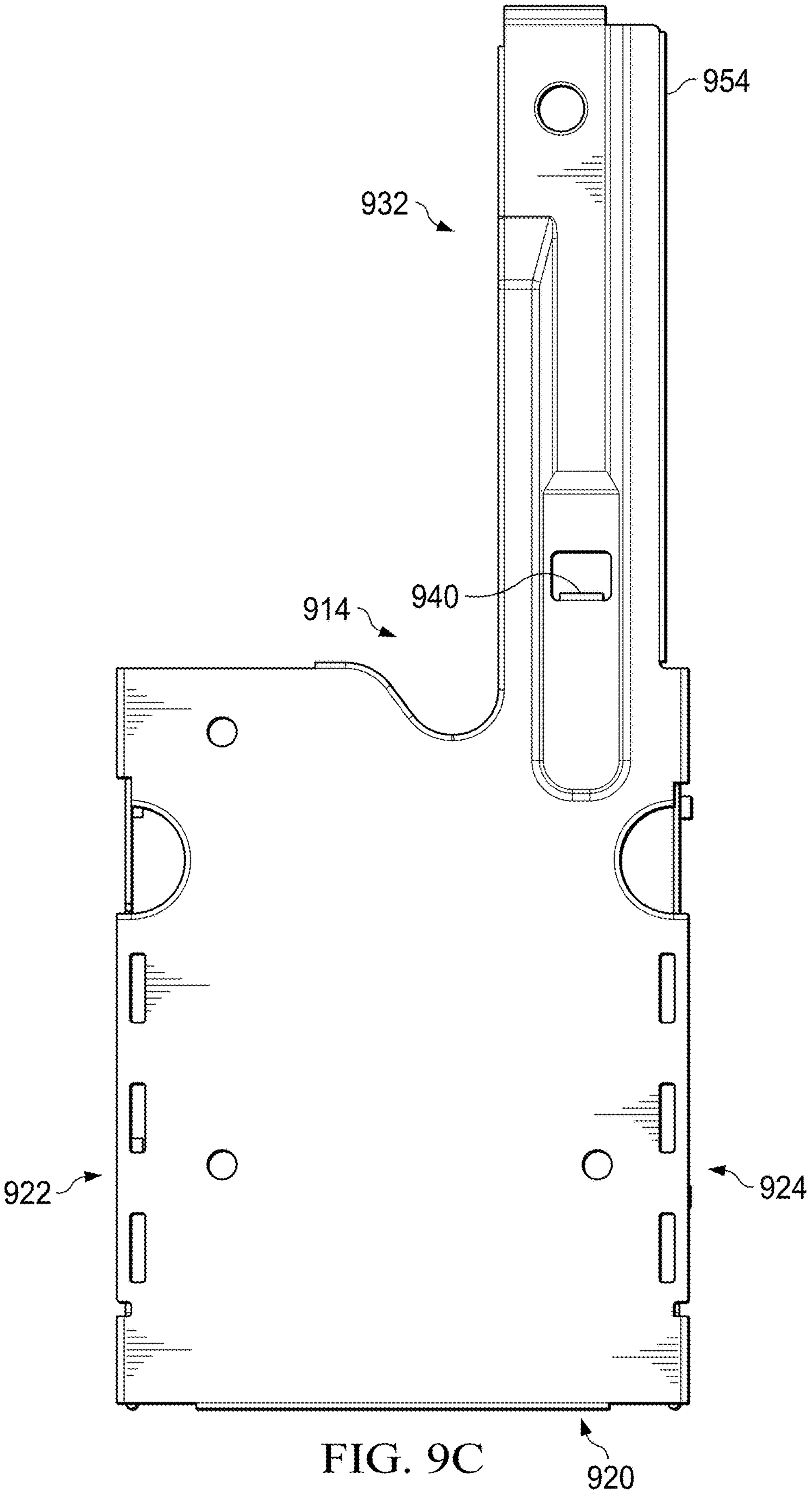
Figure 9D:
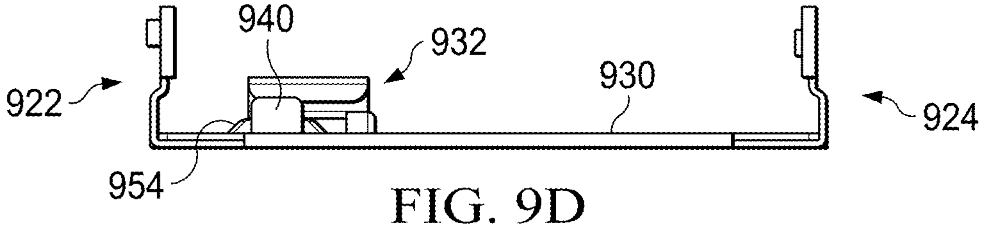
Figure 9E:
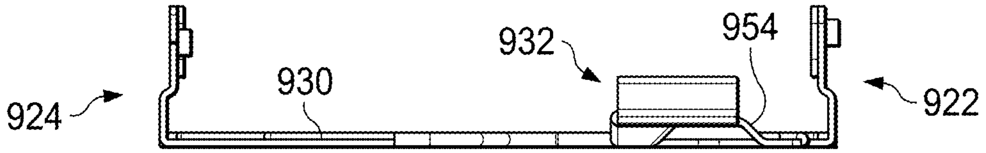
Figure 9F:
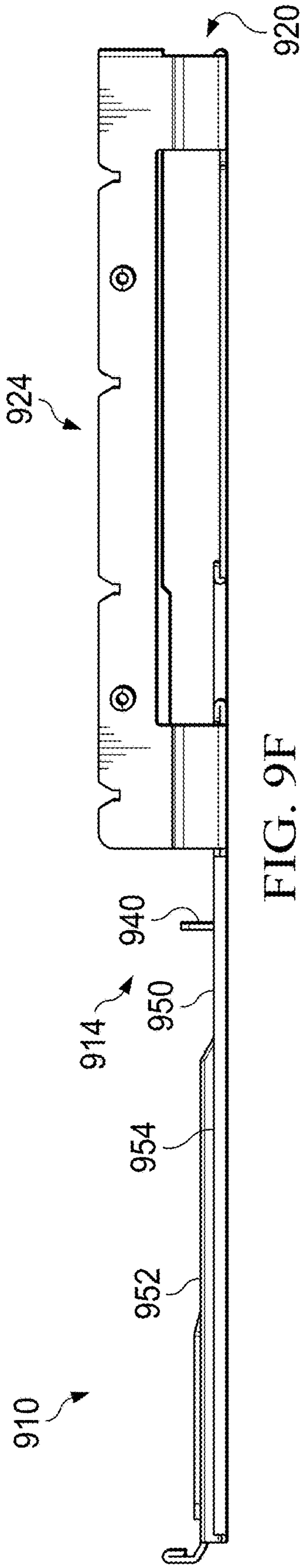
Figure 9G:
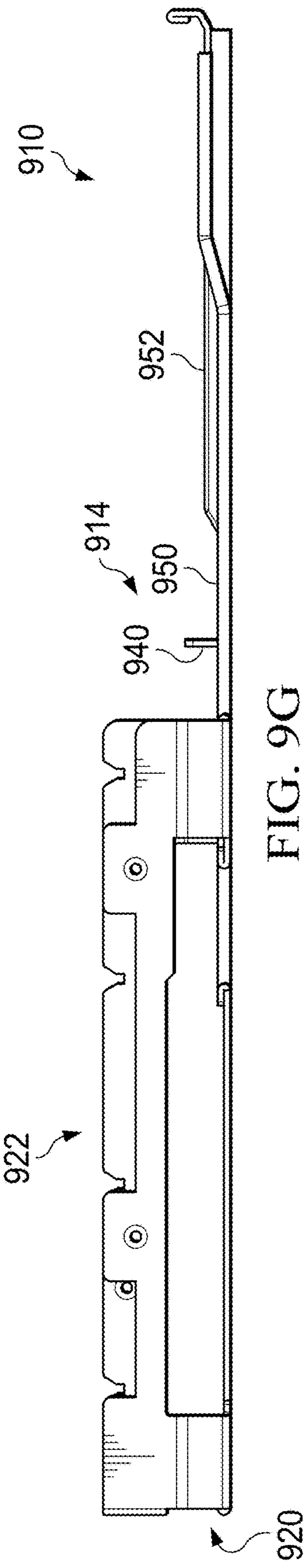

FIGS. 9A, 9B, 9C, 9D, 9E, 9F and 9G, generally referred to as FIG. 9, show a plurality of views of a storage component tray component 910. More specifically, FIG. 9A shows a top perspective view of a storage component tray component. FIG. 9B shows a top view of a storage component tray component. FIG. 9C shows a bottom view of a storage component tray component. FIG. 9D shows a front view of a storage component tray component. FIG. 9E shows a rear view of a storage component tray component. FIG. 9F shows a left side view of a storage component tray component. FIG. 9G shows a right side view of a storage component tray component. In certain embodiments, the storage component tray component 910 corresponds to storage system tray 614.

In certain embodiments, the storage system tray system 910 includes a base panel 920, a right wall 922, a left wall 924, or a combination thereof. In certain embodiments, the right wall 922 extends substantially perpendicularly (i.e., +/−20%) from the base panel 920. In certain embodiments, the left wall 924 extends substantially perpendicularly (i.e., +/−20%) from the base panel 920. It will be appreciated that the orientations of the walls will be reversed when the storage system is installed at the rear of the information handling systems (e.g., the right wall 922 is effectively a left wall). In certain embodiments, the right wall 922 includes interior guile slots, exterior guide slots, or a combination thereof. In certain embodiments, the left wall 924 includes interior guile slots, exterior guide slots, or a combination thereof.

In certain embodiments, the base panel 920 includes a base portion 930 and a tray extension 932. In certain embodiments, the tray extension 932 extends substantially horizontally (i.e., +/−20%) from the base portion 930. In certain embodiments, the tray extension 932 is configured as an arm extending substantially horizontally (i.e., +/−20%) from the base portion 930. In certain embodiments, the tray extension 932 extends from a rear edge of the base portion 930. In certain embodiments, a width of the tray extension 932 is less than a width of the base portion 930. In certain embodiments, the tray extension 932 extends close (i.e., 0.05 cm+/−20%) to a side edge of the rear edge of the base portion 930. In certain embodiments, the tray extension 932 is integral with the base portion 930 of the storage system tray 920 component. In certain embodiments, the base portion 930 and the tray extension 932 are integrated as a single component.

In certain embodiments, the tray extension includes the cold plug plunger aperture 934 into which a cold plug plunger device may fit. In certain embodiments, the cold plug plunger aperture 934 is physically positioned on the tray extension component 932 to prevent external hot plugging of the storage system cold plug system. In certain embodiments, the cold plug plunger device prevents a storage component from being hot plugged into a chassis of an information handling system. In certain embodiments, the cold plug plunger device prevents BOSS storage components, OCP type storage components, or a combination thereof, from being hot plugged into a chassis of an information handling system.

In certain embodiments, the tray extension 934 includes a stop projection 940. In certain embodiments, the stop projection 940 extends substantially perpendicularly (i.e., +/−20%) from the tray extension 934. In certain embodiments, the stop projection 940 includes a bend which extends from the tray extension 934. In certain embodiments, the bend extends substantially perpendicularly (i.e., +/−20%) from the tray extension 934. In certain embodiments, the stop projection 940 prevents installation of an OCP type component into the storage system tray system 910. In certain embodiments, the stop projection 940 is positioned to stop insertion of a BOSS type storage system. In certain embodiments, the stop projection 940 is positioned to stop insertion of a BOSS type storage system when the BOSS type storage system is fully inserted within the storage system tray system 910. In certain embodiments, the stop projection 940 is positioned to interact with an indented portion of a base of a BOSS type storage system. In certain embodiments, the stop projection 940 is positioned to interact with an extended portion of a base of an OCP type storage system.

In certain embodiments, the tray extension 934 includes a first raised portion 950, a second raised portion 952, an edge structure 954, or a combination thereof. In certain embodiments, the stop projection 940 is positioned on the first raised portion 950. In certain embodiments, the second raised portion 952 defines the plunger aperture 934 through which the plunger device is mounted. In certain embodiments, the second raised portion 952 includes a corresponding interior raised edge 960. In certain embodiments, the edge structure 954 extends along an outside edge of the tray extension. In certain embodiments, the edge structure 954 extends along an outside edge contiguous with a portion of the first raised portion 950. In certain embodiments, the edge structure 954 extends along an outside edge contiguous with a portion of the second raised portion 952.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only, and are not exhaustive of the scope of the invention.

Consequently, the invention is intended to be limited only by the spirit and scope of the appended claims, giving full cognizance to equivalents in all respects.

What is claimed is:

1. A tray system for use with a storage system for an information handling system, comprising:
a right wall portion;
a left wall portion; and,
a base panel component, the right wall portion extending substantially perpendicularly from the base panel component, the left wall portion extending substantially perpendicularly from the base panel component, the base panel component comprising a base panel portion and a tray extension, the tray extension extending horizontally from a rear edge of the base panel portion, the tray extension being configured to perform a cold plug function.

2. The tray system of claim 1, wherein:
the base panel component comprises a plunger device, the plunger device interacting with a chassis of the information handling system to perform the cold plug function.

3. The tray system of claim 2, wherein:
the plunger device interacts with a first stop of the chassis as the storage system is inserted into the chassis of the information handling system, interaction between the plunger device and the first stop preventing further insertion of the storage system into the chassis.

4. The tray system of claim 3, wherein:
the plunger device is activated to allow further insertion of the storage system into the chassis.

5. The tray system of claim 1, wherein:
the storage system comprises a boot optimized storage system (BOSS) type storage system.

6. The tray system of claim 5, wherein:
the base panel component comprises a stop projection, the stop projection preventing installation of components other than the BOSS type storage system.

7. A storage system for use an information handling system comprising:
a storage component; and,
a tray system for mounting the storage system, the tray system comprising:
a right wall portion;
a left wall portion; and,
a base panel component, the right wall portion extending substantially perpendicularly from the base panel component, the left wall portion extending substantially perpendicularly from the base panel component, the base panel component comprising a base panel portion and a tray extension, the tray extension extending horizontally from a rear edge of the base panel portion, the tray extension being configured to perform a cold plug function.

8. The bottom system of claim 7, wherein:
the base panel component comprises a plunger device, the plunger device interacting with the chassis of the information handling system to perform the cold plug function.

9. The bottom system of claim 8, wherein:
the plunger device interacts with a first stop of the chassis as the storage system is inserted into the chassis of the information handling system, interaction between the plunger device and the first stop preventing further insertion of the storage system into the chassis.

10. The bottom system of claim 9, wherein:
the plunger device is activated to allow further insertion of the storage system into the chassis.

11. The bottom system of claim 7, wherein:
the storage system comprises a boot optimized storage system (BOSS) type storage system.

12. The bottom system of claim 11, wherein:
the base panel component comprises a stop projection, the stop projection preventing installation of components other than the BOSS type storage system.

13. A system comprising:
a chassis;
a processor contained within the chassis;
a data bus coupled to the processor; and,
a storage system;
a tray system for mounting the storage system within the chassis, the tray system comprising:
a right wall portion;
a left wall portion; and,
a base panel component, the right wall portion extending substantially perpendicularly from the base panel component, the left wall portion extending substantially perpendicularly from the base panel component, the base panel component comprising a base panel portion and a tray extension, the tray extension extending horizontally from a rear edge of the base panel portion, the tray extension being configured to perform a cold plug function.

14. The system of claim 13, wherein:
the base panel component comprises a plunger device, the plunger device interacting with the chassis of the information handling system to perform the cold plug function.

15. The system of claim 14, wherein:
the plunger device interacts with a first stop of the chassis as the storage system is inserted into the chassis of the information handling system, interaction between the plunger device and the first stop preventing further insertion of the storage system into the chassis.

16. The system of claim 15, wherein:

the plunger device is activated to allow further insertion of the storage system into the chassis.

17. The system of claim 13, wherein:

the storage system comprises a boot optimized storage system (BOSS) type storage system.

18. The system of claim 17, wherein:

the base panel component comprises a stop projection, the stop projection preventing installation of components other than the BOSS type storage system.

* * * * *